United States Patent
Mochizuki et al.

(10) Patent No.: US 11,538,890 B2
(45) Date of Patent: Dec. 27, 2022

(54) DISPLAY DEVICE INCLUDING PLURAL LINES

(71) Applicant: Japan Display Inc., Tokyo (JP)

(72) Inventors: Kazuhide Mochizuki, Tokyo (JP); Yoshiro Aoki, Tokyo (JP)

(73) Assignee: Japan Display Inc., Tokyo (JP)

( * ) Notice: Subject to any disclaimer, the term of this patent is extended or adjusted under 35 U.S.C. 154(b) by 176 days.

(21) Appl. No.: 17/017,981

(22) Filed: Sep. 11, 2020

(65) Prior Publication Data
US 2020/0411627 A1      Dec. 31, 2020

Related U.S. Application Data

(63) Continuation of application No. PCT/JP2019/008484, filed on Mar. 4, 2019.

(30) Foreign Application Priority Data

Mar. 13, 2018  (JP) .............................. JP2018-045917

(51) Int. Cl.
*H01L 27/32* (2006.01)
*H01L 51/00* (2006.01)

(52) U.S. Cl.
CPC ...... *H01L 27/3276* (2013.01); *H01L 51/0097* (2013.01)

(58) Field of Classification Search
None
See application file for complete search history.

(56) References Cited

U.S. PATENT DOCUMENTS

| 2014/0254111 | A1 | 9/2014 | Yamazaki et al. |
| 2016/0079336 | A1* | 3/2016 | Youn ................... H01L 51/0097 257/40 |
| 2018/0374422 | A1* | 12/2018 | Fujikawa ............. G09G 3/3648 |
| 2019/0058028 | A1* | 2/2019 | Won ........................ H01L 51/56 |

FOREIGN PATENT DOCUMENTS

JP      2014-197181 A      10/2014

\* cited by examiner

*Primary Examiner* — J. E. Schoenholtz
(74) *Attorney, Agent, or Firm* — Maier & Maier, PLLC

(57) ABSTRACT

According to one embodiment, a display device includes an insulating substrate and lines. The lines include first lines each including a first linear portion and a second linear portion. The first linear portions extend in a first direction and are arranged at intervals in a second direction. The second linear portions extend in a third direction and are arranged at intervals in a fourth direction. A length of each of the first linear portions changes gradually in the second direction. A length of each of the second linear portions changes gradually in the fourth direction.

25 Claims, 18 Drawing Sheets

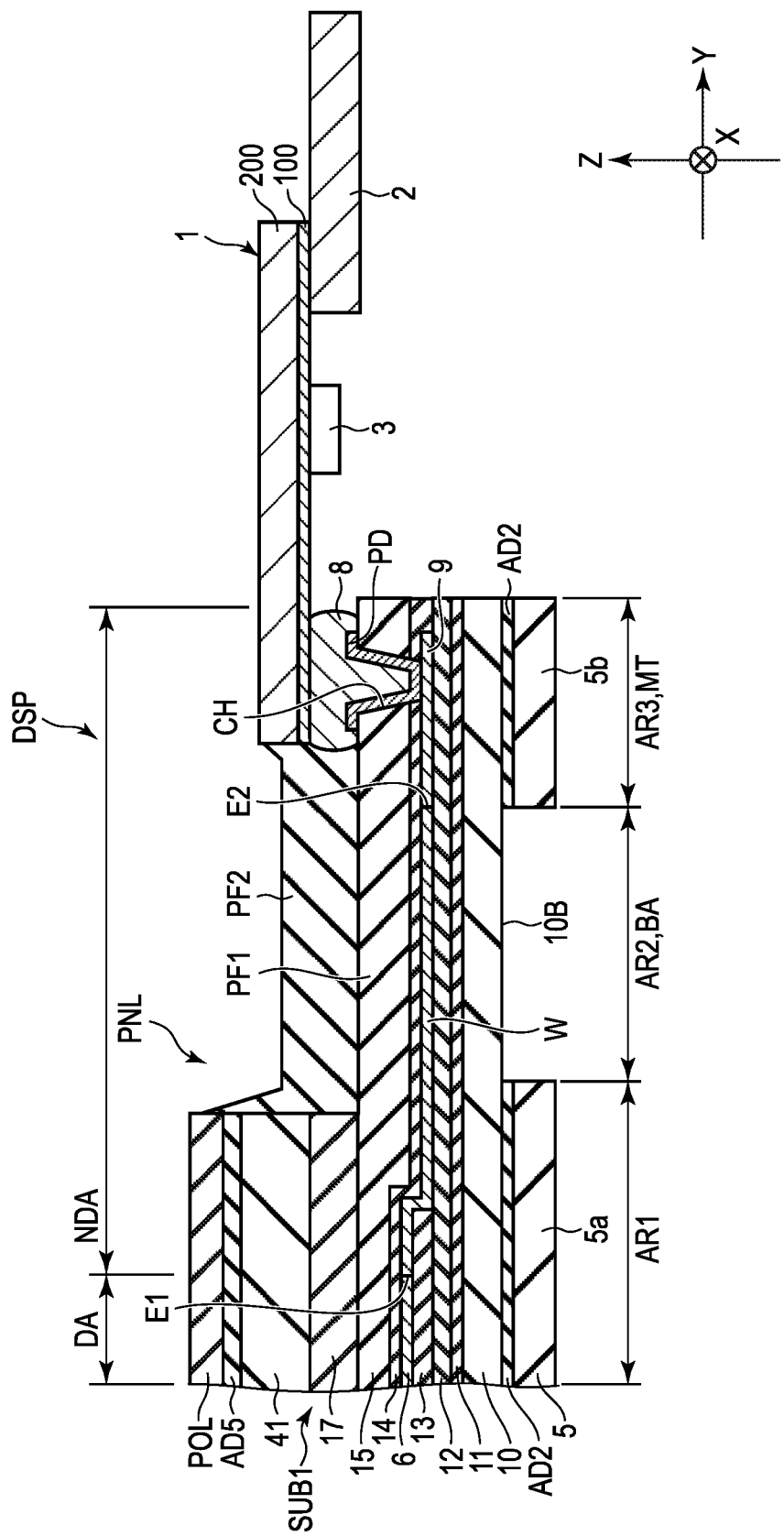
F I G. 3

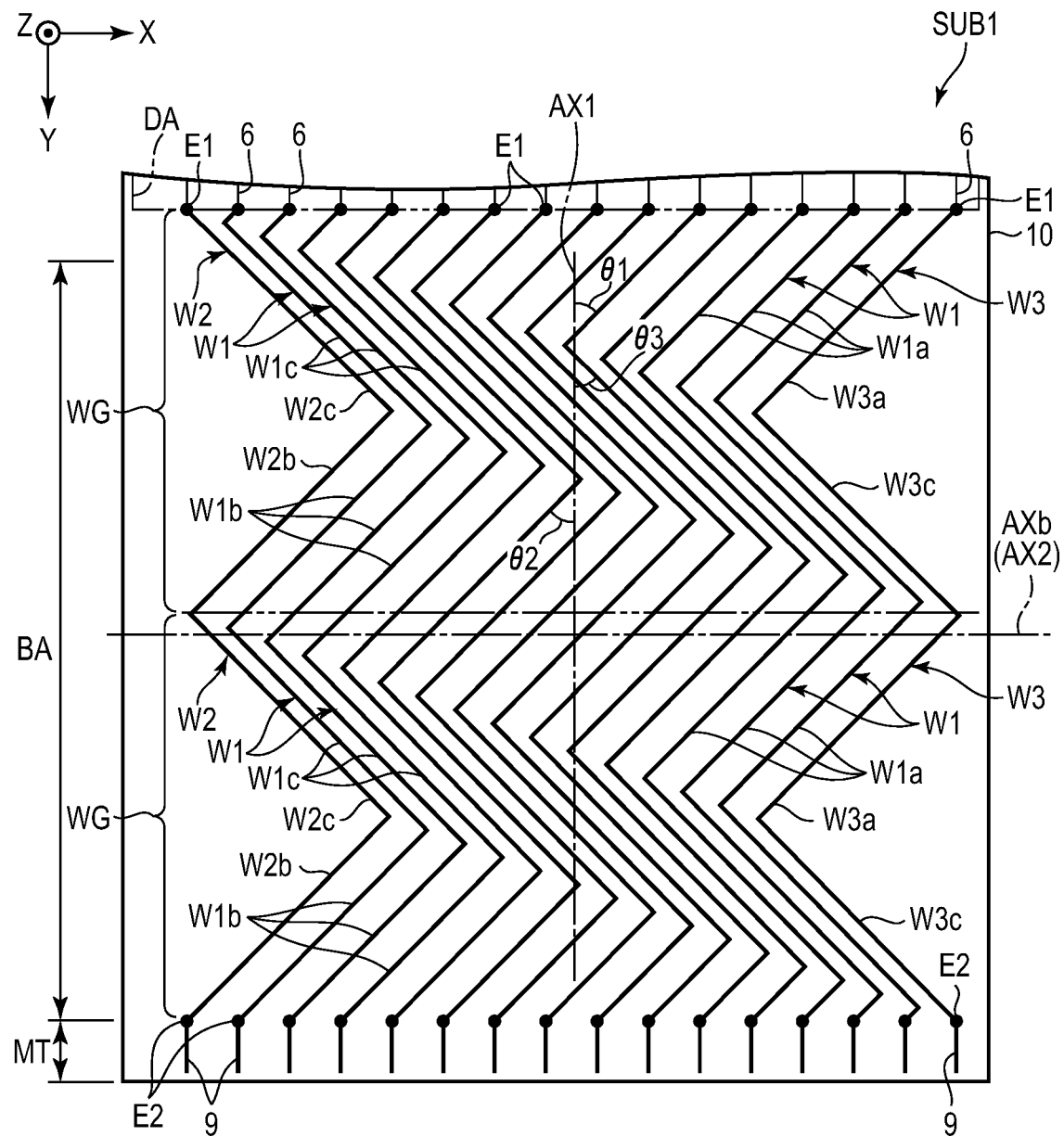
F I G. 17

US 11,538,890 B2

DISPLAY DEVICE INCLUDING PLURAL LINES

CROSS-REFERENCE TO RELATED APPLICATIONS

This application is a Continuation Application of PCT Application No. PCT/JP2019/008484, filed Mar. 4, 2019 and based upon and claiming the benefit of priority from Japanese Patent Application No. 2018-045917, filed Mar. 13, 2018, the entire contents all of which are incorporated herein by reference.

FIELD

Embodiments described herein relate generally to a display device.

BACKGROUND

In recent years, a sheet-like display device using a flexible substrate has been commercialized. Such a display device has attracted attention as a light and thin display device. For example, a PI film (a polyimide film made of a coating film of a polyimide precursor containing solution) is used for the flexible substrate. In order to narrow the frame of the display device, the flexible substrate is folded and put in an electronic device and the like.

BRIEF DESCRIPTION OF THE DRAWINGS

FIG. 3 is another sectional view showing the display device shown in FIG. 1 and showing a non-display area and the like.

FIG. 5 is a plan view showing part of a first substrate of the display panel and showing the bend area and the like.

FIG. 7 is a plan view showing part of a first substrate of a display panel of a display device according to a first modification to the first embodiment, and showing a bend area and the like.

FIG. 8 is a plan view showing part of a first substrate of a display panel of a display device according to a second modification to the first embodiment, and showing a bend area and the like.

FIG. 9 is a plan view showing part of a first substrate of a display panel of a display device according to a third modification to the first embodiment, and showing a bend area and the like.

FIG. 10 is a plan view showing part of a first substrate of a display panel of a display device according to a fourth modification to the first embodiment, and showing a bend area and the like.

FIG. 12 is a plan view showing part of a first substrate of a display panel of a display device according to a first comparative example, and showing a bend area and the like.

FIG. 13 is a plan view showing part of a first substrate of a display panel of a display device according to a second comparative example, and showing a bend area and the like.

FIG. 14 is a plan view showing part of a first substrate of a display panel of a display device according to a second embodiment, and showing a bend area and the like.

FIG. 16 is a plan view showing part of a first substrate of a display panel of a display device according to a first modification to the second embodiment, and showing a bend area and the like.

FIG. 17 is a plan view showing part of a first substrate of a display panel of a display device according to a second modification to the second embodiment, and showing a bend area and the like.

FIG. 18 is a plan view showing part of a first substrate of a display panel of a display device according to a third modification to the second embodiment, and showing a bend area and the like.

DETAILED DESCRIPTION

Figure 1:
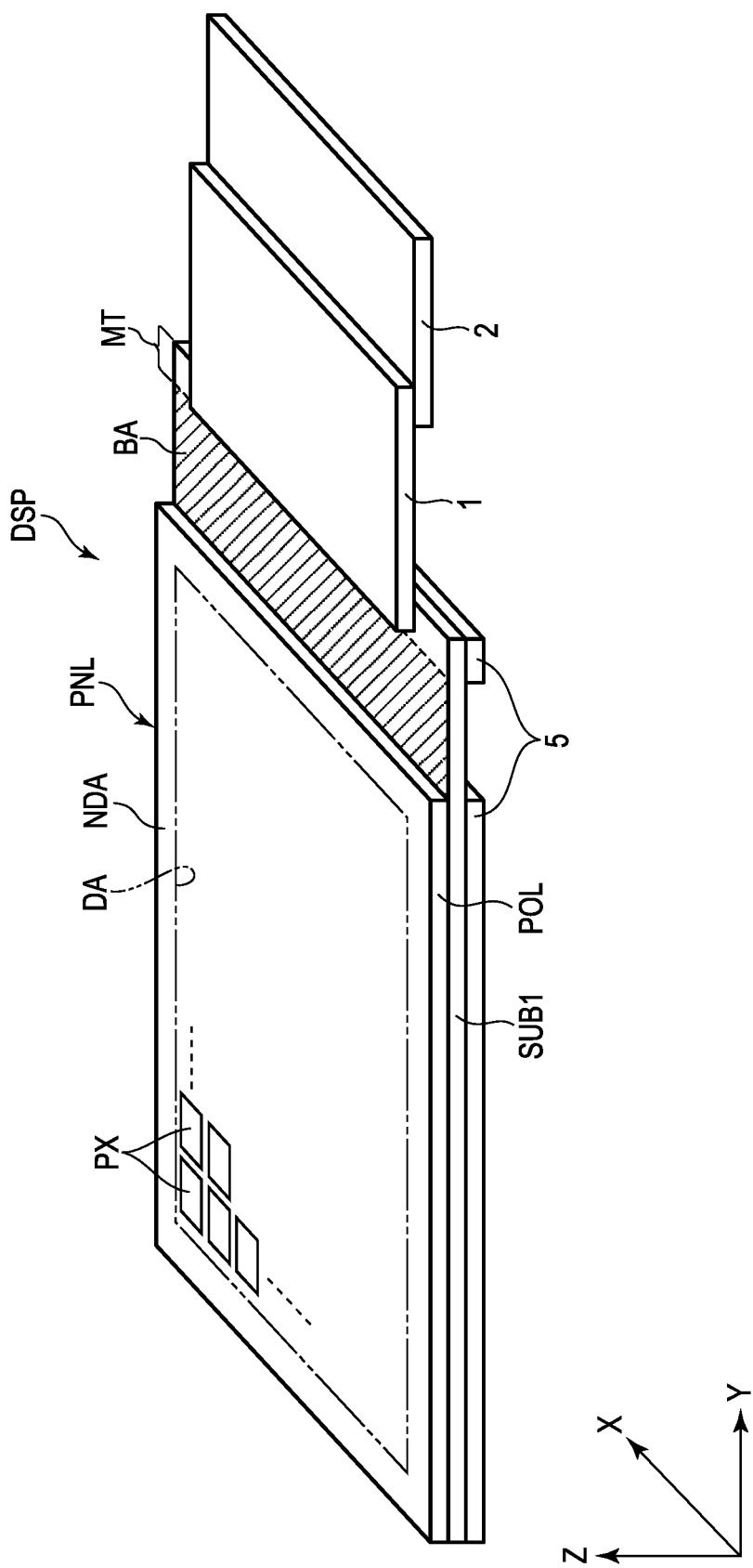
FIG. 1 is a perspective view showing a configuration of a display device according to a first embodiment.

In general, according to one embodiment, there is provided a display device comprising: an insulating substrate including a display area, a pad area, and a bending area located between the display area and the pad area and extending along a first axis; and a plurality of lines arranged above the insulating substrate and extending in the bending area from the display area to the pad area. The lines include a plurality of first lines each including a first linear portion located close to the display area and a second linear portion located closer to the pad area than the first linear portion and directly connected to the first linear portion. A plurality of first linear portions of the first lines extend in a first direction inclined at a first angle that is an acute angle in a first rotational direction with respect to the first axis, and are arranged at intervals in a second direction that is orthogonal to the first direction. A plurality of second linear portions of the first lines extend in a third direction inclined at a second angle that is an acute angle in a second rotational direction opposite to the first rotational direction with respect to the first axis, and are arranged at intervals in a fourth direction that is orthogonal to the third direction. A length of each of the first linear portions changes gradually in the second direction. A length of each of the second linear portions changes gradually in the fourth direction. In each of the first lines, the length of the second linear portion is relatively long when the length of the first linear portion is relatively short, and the length of the second linear portion is relatively short when the length of the first linear portion is relatively long.

According to another embodiment, there is provided a display device comprising: an insulating substrate including a display area, a pad area, and a bending area located between the display area and the pad area and extending along a first axis; and a plurality of lines arranged above the insulating substrate and extending in the bending area from the display area to the pad area. The lines include a plurality of first lines each including a first linear portion located close to the display area, a second linear portion located closer to the pad area than the first linear portion, and a third linear portion directly connected to the first linear portion and the second linear portion, a second line including a second linear portion located close to the pad area and a third linear portion located close to the display area and directly connected to the second linear portion, and a third line which includes a first linear portion located close to the display area and a third linear portion located close to the pad area and directly connected to the first linear portion and which is located opposite to the second line with respect to the first lines. A plurality of first linear portions of the first lines and the third line extend in a first direction inclined at a first angle that is an acute angle in a first rotational direction with respect to the first axis, and are arranged at intervals in a second direction that is orthogonal to the first direction. A plurality of second linear portions of the first lines and the second line extend in a third direction inclined at a second angle that is an acute angle in the first rotational direction with respect to the first axis, and are arranged at intervals in a fourth direction that is orthogonal to the third direction. A plurality of third linear portions of the first lines, the second line and the third line extend in a fifth direction inclined at a third angle that is an acute angle in a second rotational direction opposite to the first rotational direction with respect to the first axis, and are arranged at intervals in a sixth direction that is orthogonal to the fifth direction. A length of each of the first linear portions changes gradually in the second direction. A length of each of the second linear portions changes gradually in the sixth direction. In each of the first lines, the length of the second linear portion is relatively long when the length of the first linear portion is relatively short, and the length of the second linear portion is relatively short when the length of the first linear portion is relatively long.

Embodiments will be described hereinafter with reference to the accompanying drawings. The disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc., of the respective parts are schematically illustrated in the drawings, compared to the actual modes. However, the schematic illustration is merely an example, and adds no restrictions to the interpretation of the invention. Besides, in the specification and drawings, the same elements as those described in connection with preceding drawings are denoted by like reference numerals, and a detailed description thereof is omitted unless otherwise necessary.

First Embodiment

First, a display device according to a first embodiment will be described in detail. FIG. 1 is a perspective view showing a configuration of a display device DSP according to the first embodiment.

As shown in FIG. 1, the X and Y directions are orthogonal to each other. The Z direction is orthogonal to each of the X and Y directions. Note that, unlike in the first embodiment, the X and Y directions may intersect at an angle other than 90°. In the first embodiment described below, the display device is an organic electro-luminescent (EL) display device.

In the first embodiment, the side from a first substrate SUB1 toward the polarizer POL (the direction of the arrow in the Z direction) is defined as the upper side, and the side from the polarizer POL toward the first substrate SUB1 (a direction opposite to the direction of the arrow in the Z direction) is defined as the lower side. Such expressions as "a second member on a first member" or "a second member under a first member" covers the situation where the second member is in contact with or spaced apart from the first member.

The display device DSP includes a display panel PNL, a wiring substrate 1 and a wiring substrate 2. The display panel PNL includes a first substrate SUB1, a polarizer POL opposed to the first substrate SUB1 and a support member 5. In the first embodiment, the display panel PNL is an organic EL display panel having an organic EL element as an electro-optic element.

The display panel PNL includes a display area DA for displaying an image and a non-display area NDA outside the display area DA. The display panel PNL includes a plurality of pixels PX in the display area DA. The pixels PX are arranged in matrix in the X and Y directions.

The first substrate SUB1 has a pad area MT located outside an area overlapping the polarizer POL. More specifically, three edges of the first substrate SUB1 are aligned with three edges of the polarizer POL in the Z direction. The length of the edge parallel to the X direction of the first substrate SUB1 is substantially equal to that of the edge parallel to the X direction of the polarizer POL. The length of the edge parallel to the Y direction of the first substrate SUB1 is larger than that of the edge parallel to the Y direction of the polarizer POL. That is, the area of the first substrate SUB1 which is parallel to the X-Y plane is larger than that of the polarizer POL which is parallel to the X-Y plane. The X-Y plane is defined by the X and Y directions.

In the example shown, the wiring substrate 1 is mounted on the pad area MT in the non-display area NDA. In the example shown, the length of the edge parallel to the X direction of the wiring substrate 1 is smaller than that of the edge parallel to the X direction of the first substrate SUB1 and the polarizer POL, but may be equal to each other. The wiring substrate 1 is coupled to the display panel PNL. The wiring substrate 2 is located on the undersurface of the wiring substrate 1 and coupled to the wiring substrate 1.

The wiring substrates 1 and 2 are, for example, flexible substrates having flexibility. In the first embodiment, at least part of the flexible substrates has only to include a flexible portion made of a bendable material.

In the first embodiment, the display device DSP includes a bending area BA that is an area to be bent when it is held in a housing of an electronic device or the like. In the drawing, the bending area BA is hatched. That is, the bending area BA is bent such that the wiring substrates 1 and 2 are arranged below the display area DA. The bending area BA is located within the non-display area NDA.

The support member 5 is located under the display panel PNL and stuck to the first substrate SUB1. The support member 5 is not opposed to the bending area BA in the Z direction. A first insulating substrate 10 includes the display area DA, a bending area BA and a pad area MT.

Figure 2:
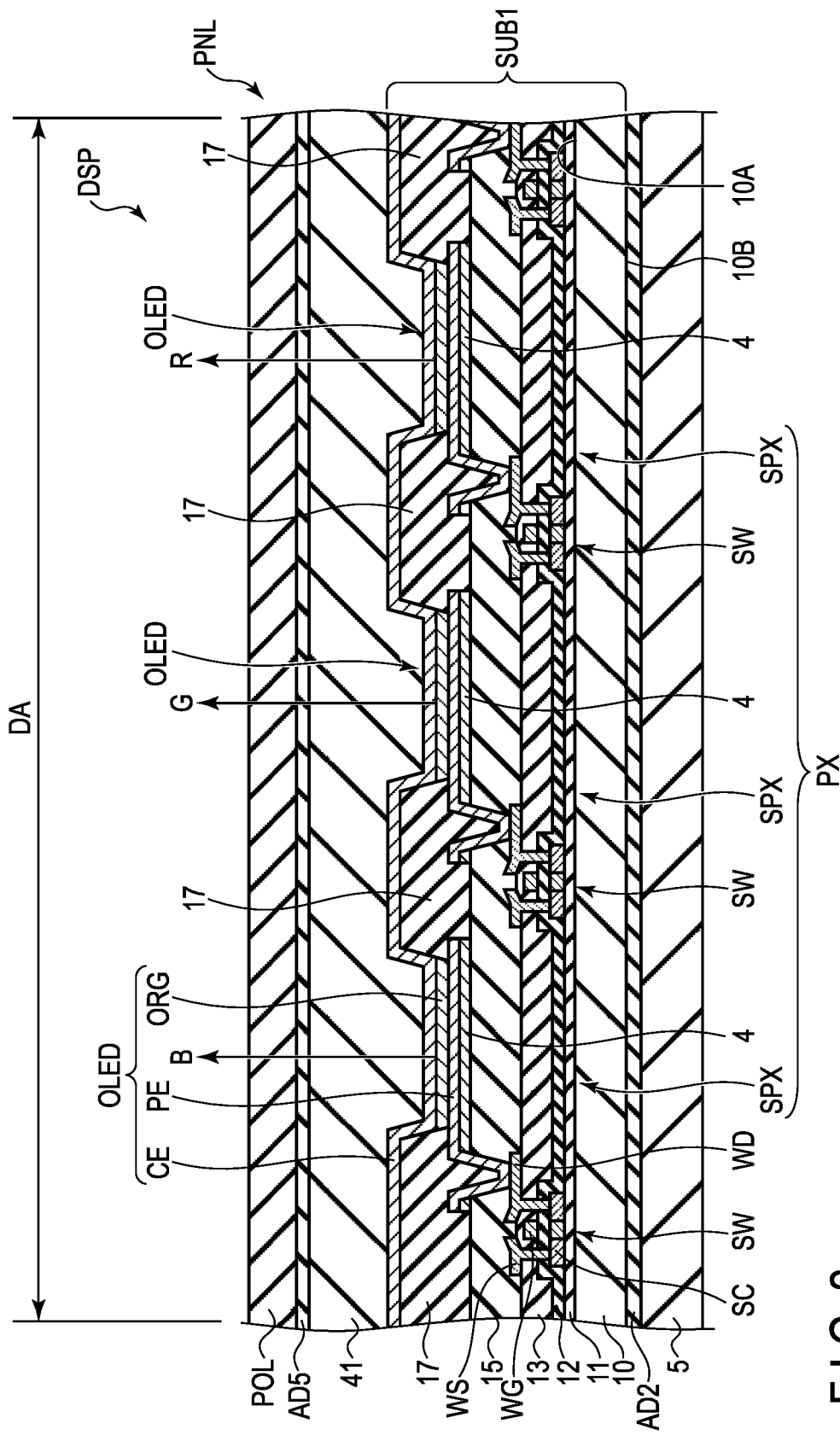
FIG. 2 is a sectional view showing a display area of the display device shown in FIG. 1.

FIG. 2 is a sectional view showing a display area DA of the display device DSP shown in FIG. 1.

As shown in FIG. 2, the first substrate SUB1 includes a first insulating substrate 10, a plurality of switching elements SW, a plurality of light reflecting layers 4, a plurality of organic EL elements OLED, a sealing layer 41, a support member 5 and the like. The pixels PX each have a plurality of sub-pixels SPX. In the first embodiment, each pixel PX has three sub-pixels SPX. Each of the sub-pixels SPX includes a single switching element SW, a single organic EL element OLED and the like. The description of FIG. 2 is directed to the configuration of a single sub-pixel SPX, but the same is applied to the configurations of the other sub-pixels SPX.

The first insulating substrate 10 is formed of an organic insulating material, such as polyimide (PI). Thus, it may be appropriate that the first insulating substrate 10 be referred to as an organic insulating substrate (resin substrate). Alternatively, it may be appropriate that the first insulating substrate 10 be referred to as an insulating layer, an organic insulating layer or a resin layer. The first insulating substrate 10 has a first surface 10A and a second surface 10B opposed to the first surface 10A. The first insulating substrate 10 is covered with a first insulating layer 11.

The switching element SW is formed on the first insulating layer 11. In the example shown, the switching element SW is formed of a top gate thin-film transistor, but may be formed of a bottom gate thin-film transistor. The switching element SW includes a semiconductor layer SC formed on the first insulating layer 11. The semiconductor layer SC is covered with the second insulating layer 12. The second insulating layer 12 is also formed on the first insulating layer 11.

The gate electrode WG of the switching element SW is formed on the second insulating layer 12 and is located directly above the semiconductor layer SC. The gate electrode WG is covered with a third insulating layer 13. The third insulating layer 13 is also formed on the second insulating layer 12.

The first insulating layer 11, second insulating layer 12 and third insulating layer 13 are formed of an inorganic insulating material such as silicon oxide and silicon nitride.

The source electrode WS and drain electrode WD of the switching element SW are formed on the third insulating layer 13. The source electrode WS and drain electrode WD are electrically connected to the semiconductor layer SC through contact holes penetrating the second insulating layer 12 and the third insulating layer 13, respectively. The switching element SW is covered with a fifth insulating layer 15. The fifth insulating layer 15 is also formed on the third insulating layer 13. The fifth insulating layer 15 is formed of an organic insulating material such as transparent resin.

The light reflecting layers 4 are arranged on the fifth insulating layer 15. The light reflecting layers 4 are formed of a metal material having a high light reflectance, such as aluminum and silver. Note that the surface of each of the light reflecting layers 4 (namely, the surface opposed to the polarizer POL) may be a flat surface and an uneven surface to impart light scattering properties.

The organic EL elements OLED are formed on the fifth insulating layer 15. In the example shown, the organic EL elements OLED are electrically connected to their respective switching elements SW. For example, the pixel PX includes an organic EL element OLED that emits red light, an organic EL element OLED that emits green light and an organic EL element OLED that emits blue light. However, the color of light emitted from each of the organic EL elements OLED is not limited to that of the first embodiment, and various modifications can be made to the color.

Unlike in the first embodiment, each organic EL element OLED may be configured to emit white light. In this case, the display panel PNL may include a color filter.

Each organic EL element OLED includes a pixel electrode PE formed on the light reflecting layer 4. The pixel electrode PE is formed of a metal material such as aluminum and silver or a transparent conductive material such as indium tin oxide (ITO) and indium zinc oxide (IZO).

A barrier insulating layer 17 is provided on the fifth insulating layer 15 and the pixel electrodes PE. The barrier insulating layer 17 has through holes at a positions corresponding to the pixel electrodes PE or slits at positions corresponding to a column or a row in which the pixel electrodes PE are formed. Here, as an example, the barrier insulating layer 17 has through holes at positions corresponding to the pixel electrodes PE.

Each organic EL element OLED further includes an organic light emitting layer ORG and a common electrode CE. One of the pixel electrode PE and the common electrode CE is an anode and the other is a cathode. The organic light emitting layer ORG is positioned on the pixel electrode PE.

The common electrode CE is located on the organic light emitting layer ORG and the barrier insulating layer 17. The common electrode CE is formed of a transparent conductive material such as ITO and IZO. In the example shown, the organic EL elements OLED are partitioned by the barrier insulating layer 17. Though not shown, the organic EL elements OLED are preferably sealed with a transparent sealing film.

Unlike in the first embodiment, the organic EL elements may be configured as a so-called bottom emission type ones which emit light toward the first insulating substrate 10. In this case, for example, the light reflecting layer 4 is adjusted to various positions.

The sealing layer 41 covers the organic EL elements OLED to prevent oxygen and moisture from entering and prevent the elements from deteriorating. Note that the sealing layer 41 may include a stacked layer body of an inorganic film and an organic film. The polarizer POL is bonded to the sealing layer 41 by an adhesive layer AD5.

The support member 5 is a resin film and is disposed under the first substrate SUB1. The support member 5 is bonded to the second surface 10B of the first insulating substrate 10 by an adhesive layer AD2. As the material of the support member 5, for example, an inexpensive material that is excellent in heat resistance, gas barrier properties, moisture resistance and strength is preferable. The support member 5 has heat resistance to such an extent that it does not deteriorate or deform at a process temperature in the process of manufacturing the display device DSP, for example. Furthermore, the support member 5 has, for example, greater strength than the first insulating substrate 10 and functions as a support layer. The addition of the support member 5 makes it difficult to curve the display panel PNL in a state that it receives no stress from the outside. The support member 5 functions as a barrier layer having, for example, moisture resistance to prevent moisture and the like from entering the first insulating substrate 10 and gas barrier properties to prevent gas from entering it. In the first embodiment, the support member 5 is a film formed of, for example, polyethylene terephthalate.

Each of the pixels PX shown in FIG. 1 is, for example, a minimum unit of a color image, and includes the organic EL elements OLED described above.

FIG. 3 is another sectional view showing the display device DSP shown in FIG. 1 and showing a non-display area NDA and the like.

As shown in FIG. 3, the support member 5 includes a first portion 5a and a second portion 5b spaced away from the first portion 5a. The display panel PNL includes a first area AR1, a second area AR2 adjacent to the first area AR1, and a third area AR3 adjacent to the second area AR2. The second area AR2 is located between the first and third areas AR1 and AR3.

In the first embodiment, a view of the first substrate SUB1 from the polarizer POL is defined as a planar view. The first area AR1 corresponds to an area overlapping the first portion 5a in planar view. The second area AR2 corresponds to an area where the support member 5 is not disposed in planar view. The bending area BA shown in FIG. 1 is included in the second area AR2. Alternatively, the bending area BA is an area that is equivalent to the second area AR2. The third area AR3 is a pad area MT and corresponds to an area overlapping the second portion 5b in planar view. The first portion 5a is bonded to the first area AR1 by the adhesive layer AD2, and the second portion 5b is bonded to the third area AR3 by the adhesive layer AD2.

A signal line 6 is arranged on the third insulating layer 13 and located in at least the display area DA. A line W is disposed above the first insulating substrate 10, and extends in the bending area BA continuously from the display area DA toward the pad area MT. The line W corresponds to a power supply line, one of various control lines, and the like. A connection line 9 is arranged on the second insulating layer 12 and located in the pad area MT.

The line W shown in FIG. 3 is disposed at least on the second insulating layer 12, and is formed integrally with the signal line 6 and the connection line 9. The line W includes a first end E1 located alongside the display area DA and a second end E2 located alongside the pad area MT. The first end E1 is located in an area between the boundary between the display area DA and the non-display area NDA and the boundary between the first area AR1 and the bending area BA. The second end E2 is located at the boundary between the bending area BA and the pad area MT or in the pad area MT. In the example shown in FIG. 3, the first end E1 is located at the boundary between the display area DA and the non-display area NDA, and the second end E2 is located at the boundary between the bending area BA and the pad area MT.

The first substrate SUB1 further includes a fourth insulating layer 14 and a second protective film PF2. The fourth insulating layer 14 is arranged on the signal line 6, line W and connection line 9, and is located in the first area AR1, second area AR2 and third area AR3. The fifth insulating layer 15 is arranged on the fourth insulating layer 14. The fifth insulating layer 15 is located in the second area AR2 and third area AR3 as well as the display area DA (first area AR1). In the non-display area NDA, the fifth insulating layer 15 is located at least in the bending area BA. The fifth insulating layer 15 forms a first protective film PF1 in the bending area BA. The first protective film PF1 protects the line W and the like.

The second protective film PF2 is arranged on the fifth insulating layer 15. The second protective film PF2 is located at least in the bending area BA. In the first embodiment, the second protective film PF2 is also located in part of the first area AR1 and the third area AR3. In the example shown, the second protective film PF2 covers ends of the barrier insulating layer 17, ends of the sealing layer 41, and ends of an anisotropic conductive film 8 that is a conductive material. The pad PD is located in the third area AR3. The pad PD is disposed on the first protective film PF1 and is electrically connected to the connection line 9 through a contact hole CH formed in the fourth insulating layer 14 and the first protective film PF1.

The wiring substrate 1 is mounted on the third area AR3 with the anisotropic conductive film 8 therebetween. The wiring substrate 1 includes a core substrate 200, a connection line 100 provided on the undersurface of the core substrate 200, and a drive IC chip 3 provided on the undersurface of the core substrate 200. The drive IC chip 3 functions as, for example, a signal supply source that supplies a signal necessary for driving the display panel PNL. Note that unlike in the first embodiment, the drive IC chip 3 may be mounted on the third area AR3 without using the core substrate 200 or the connection line 100 for the display device DSP.

The bending area BA is bent and accordingly the pad PD is provided on the back side of the display panel PNL.

Figure 4:
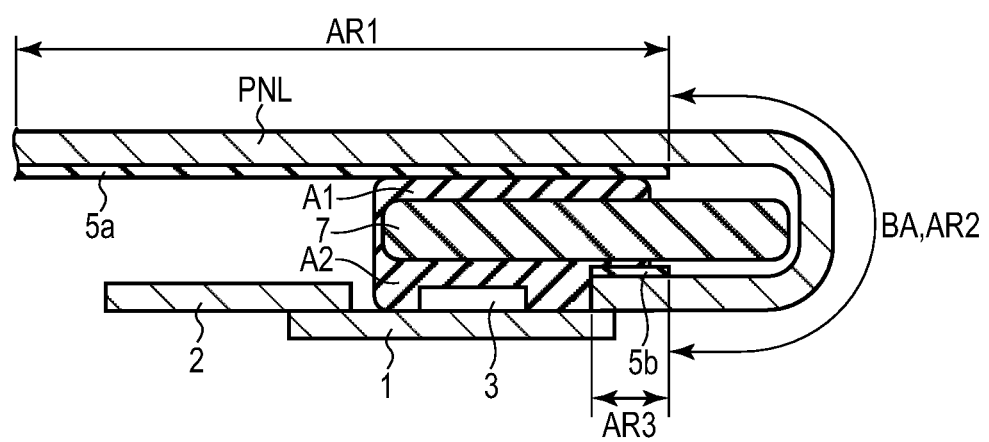
FIG. 4 is a sectional view showing the display device and showing a state in which a bend area of a display panel is bent.

FIG. 4 is a sectional view showing the foregoing display device DSP and also showing a state in which the bending area BA of the display panel PNL is bent.

As shown in FIG. 4, the bending area BA is bent so that the first portion 5a and the second portion 5b are opposed to each other. The display panel PNL includes a second area AR2 in which the support member 5 is not disposed. The bending area BA can thus be decreased in its radius of curvature. A pedestal portion 7 is interposed between the first area AR1 and the wiring substrate 1.

The adhesive layer A1 is arranged between the first area AR1 and the pedestal portion 7 to bond them together. The adhesive layer A2 is also arranged between the wiring substrate 1 and the pedestal portion 7 to bond them together. Note that the adhesive layers A1 and A2 may be connected to each other as shown in the figure or may be formed separately from each other. The adhesive layers A1 and A2 are, for example, double-faced tapes.

The display device DSP is configured as described above.

If the bending area BA of the display panel PNL is bent as described above, an electronic device or the like that holds the display panel PNL can be decreased in frame region or size. The non-display area NDA of the display panel PNL can be decreased in storage volume without reducing the width of the non-display area NDA. As described above, the support member 5 is not disposed in the second area AR2 of the display panel PNL from the viewpoint of bending the display panel PNL.

Figure 5:
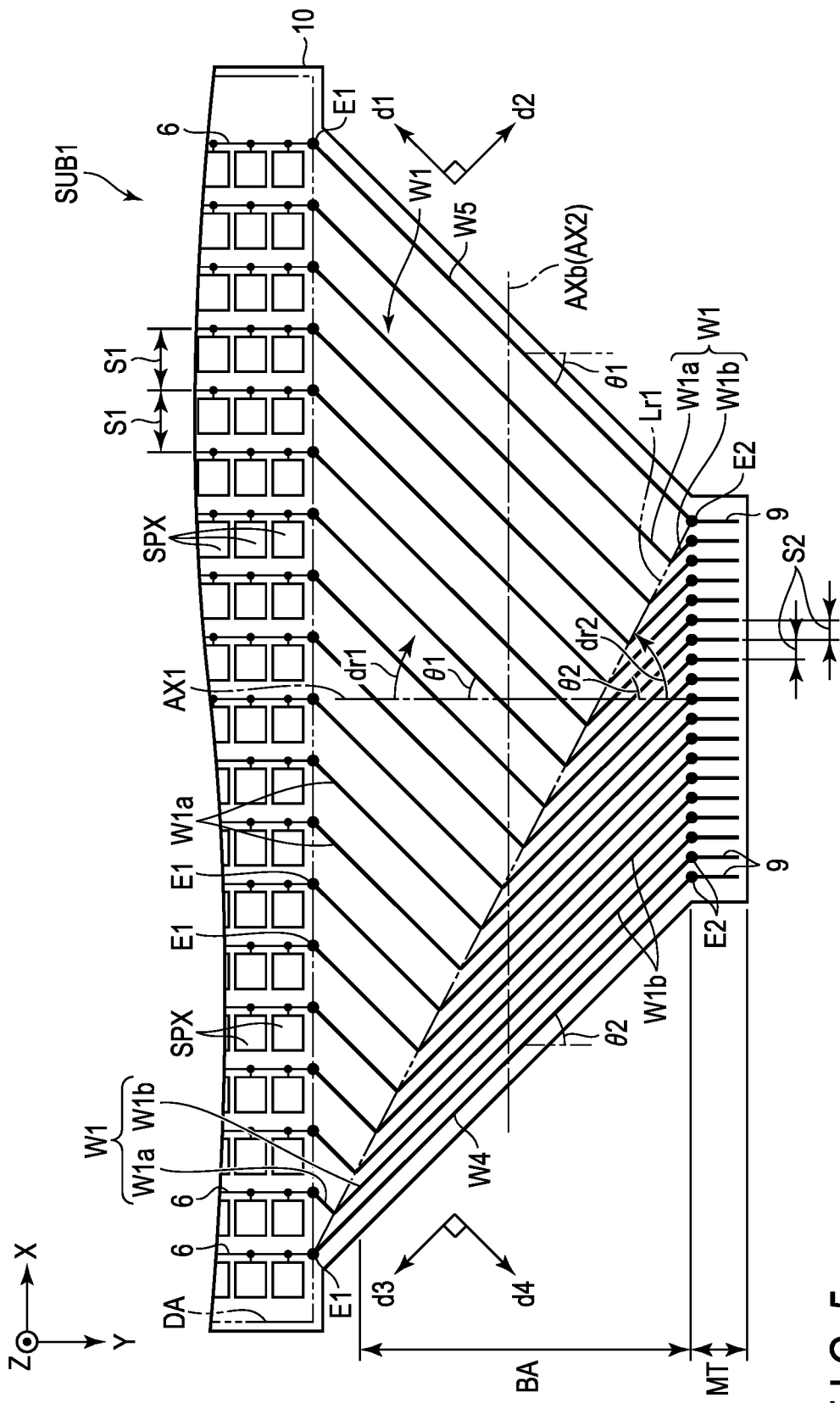

Next is a description of the non-display area NDA of the display panel PNL, especially the bending area BA. FIG. 5 is a plan view showing part of the first substrate SUB1 of the display panel PNL and showing the bending area BA and the like. Note that FIG. 5 shows a state before the bending area BA is bent.

As shown in FIG. 5, in the display area DA, a plurality of sub-pixels SPX are arranged on the first insulating substrate 10. A plurality of signal lines 6 extend in the Y direction and are arranged at intervals in the X direction. In the first embodiment, the signal lines 6 are arranged at equal intervals in the X direction. The sub-pixels SPX are connected to each of the signal lines 6.

The bending area BA of the first insulating substrate 10 extends along a first axis AX1. In the first embodiment, the first axis AX1 is an axis parallel to the Y direction. The width of the bending area BA of the first insulating substrate 10 gradually decreases from the display area DA toward the pad area MT. This shape of the bending area BA is not limited to, for example, a rectangular shape in which the corners of the display area DA close to the bending area BA are at right angles, but can be applied to a non-rectangular shape such as a circular shape and an elliptical shape. In the first embodiment, the pad area MT is located at the center of the first insulating substrate 10 in the X direction.

The bending area BA has a bending axis AXb that is orthogonal to the first axis AX1. In the first embodiment, the bending axis AXb is an axis parallel to the X direction. The bending axis AXb is a reference axis in bending the first substrate SUB1. The bending area BA is bent with the bending axis AXb as a reference. While the bending area BA is bent, the tangent of the first substrate SUB1 at the position of the bending axis AXb is parallel to the Z direction. The bending axis AXb may also be referred to as a second axis AX2 hereinafter.

A plurality of lines W include a plurality of first lines W1, a fourth line W4 and a fifth line W5. Each of the first lines W1 includes a first linear portion W1a located close to the display area DA and a second linear portion W1b located closer to the pad area MT than the first linear portion W1a and directly connected to the first linear portion W1a.

The first linear portions W1a of the first lines W1 extend in a first direction d1 and are arranged at intervals in a second direction d2 that is orthogonal to the first direction d1. The first direction d1 is a direction inclined at a first angle $\theta 1$ that is an acute angle in a first rotational direction dr1 with respect to the first axis AX1.

The second linear portions W1b of the first lines W1 extend in a third direction d3 and are arranged at intervals in a fourth direction d4 that is orthogonal to the third direction d3. The third direction d3 is a direction inclined at a second angle $\theta 2$ that is an acute angle in a second rotational direction dr2 opposite to the first rotational direction dr1 with respect to the first axis AX1.

The length of each of the first linear portions W1a gradually changes in the second direction d2. The length of each of the second linear portions W1b gradually changes in the fourth direction d4. In each of the first lines W1, when the length of each first linear portion W1a is relatively short, the length of each second linear portion W1b is relatively long, and when the length of each first linear portion W1a is relatively long, the length of each second linear portion W1b is relatively short.

The fourth line W4 and the fifth line W5 each extend in a straight line from the display area DA toward the pad area MT. The fifth line W5 is located opposite to the fourth line W4 with respect to the first lines W1.

The fourth line W4 is inclined at an acute angle of the second angle $\theta 2$ or more in the second rotational direction dr2 with respect to the first axis AX1. The fourth line W4 is adjacent to a first line W1 including the longest second linear portion W1b among the first lines W1.

The fifth line W5 is inclined at an acute angle of the first angle $\theta 1$ or more in the first rotational direction dr1 with respect to the first axis AX1. The fifth line W5 is adjacent to the first line W1 including the longest first linear portion W1a among the first lines W1.

In the first embodiment, the inclination angle of the first linear portion W1a and the inclination angle of the fifth line W5 are the same. The inclination angle of the second linear portion W1b and the inclination angle of the fourth line W4 are the same. In addition, the first angle $\theta 1$ and the second angle $\theta 2$ are the same.

Since the lines W are inclined with respect to the first axis AX1, their reliability can be heightened in the bending area BA. This is because the lines W are less likely to be adversely affected by bending stress when the bending area BA is bent. It is thus possible to suppress breakage of the lines W, such as disconnection of the lines W, generation of cracks in the lines W and peeling of the lines W. From the viewpoint of increasing the reliability of the lines W, for example, it is desirable that the first angle $\theta 1$ and the second angle $\theta 2$ be each an acute angle of 45° or more. Preferably, the first angle $\theta 1$ and second angle $\theta 2$ may vary depending on, for example, the materials of the lines W and the materials of members which located around the lines W and may apply stress to the wiring W such as the fourth insulating layer 14 and the first protective film PF1.

Each of the lines W includes a first end E1 located close to the display area DA and a second end E2 located close to the pad area MT. The locations of first ends E1 of the lines W are aligned in a direction parallel to the second axis AX2. The locations of second ends E2 of the lines W are aligned in a direction parallel to the second axis AX2. The first ends E1 are arranged at equal intervals in a direction parallel to the second axis AX2. In the first embodiment, an interval S1 between the first ends E1 is the same as the interval between the signal lines 6. The second ends E2 are arranged at equal intervals in a direction parallel to the second axis AX2. In the first embodiment, an interval S2 between the second ends E2 is narrower than the interval S1 between the first ends E1.

The first lines W1 are bent on a first reference line Lr1. The first reference line Lr1 extends in a straight line through the first end E1 of the fourth line W4 and the second end E2 of the fifth line W5.

Each of the first lines W1 includes one bending portion (bending point). The reliability of the first lines W1 is higher than that of the first lines W1 each including a plurality (a large number) of bending portions. This is because there is a high probability that the lines W will be broken at the bending portions.

Note that neither the fourth line W4 nor the fifth line W5 is bent. This is because the fourth line W4 is inclined at the second angle $\theta 2$ and the fifth line W5 is inclined at the first angle $\theta 1$. In other words, even if the fourth line W4 and the fifth line W5 include no bending portions, their reliability can be heightened.

Figure 6:
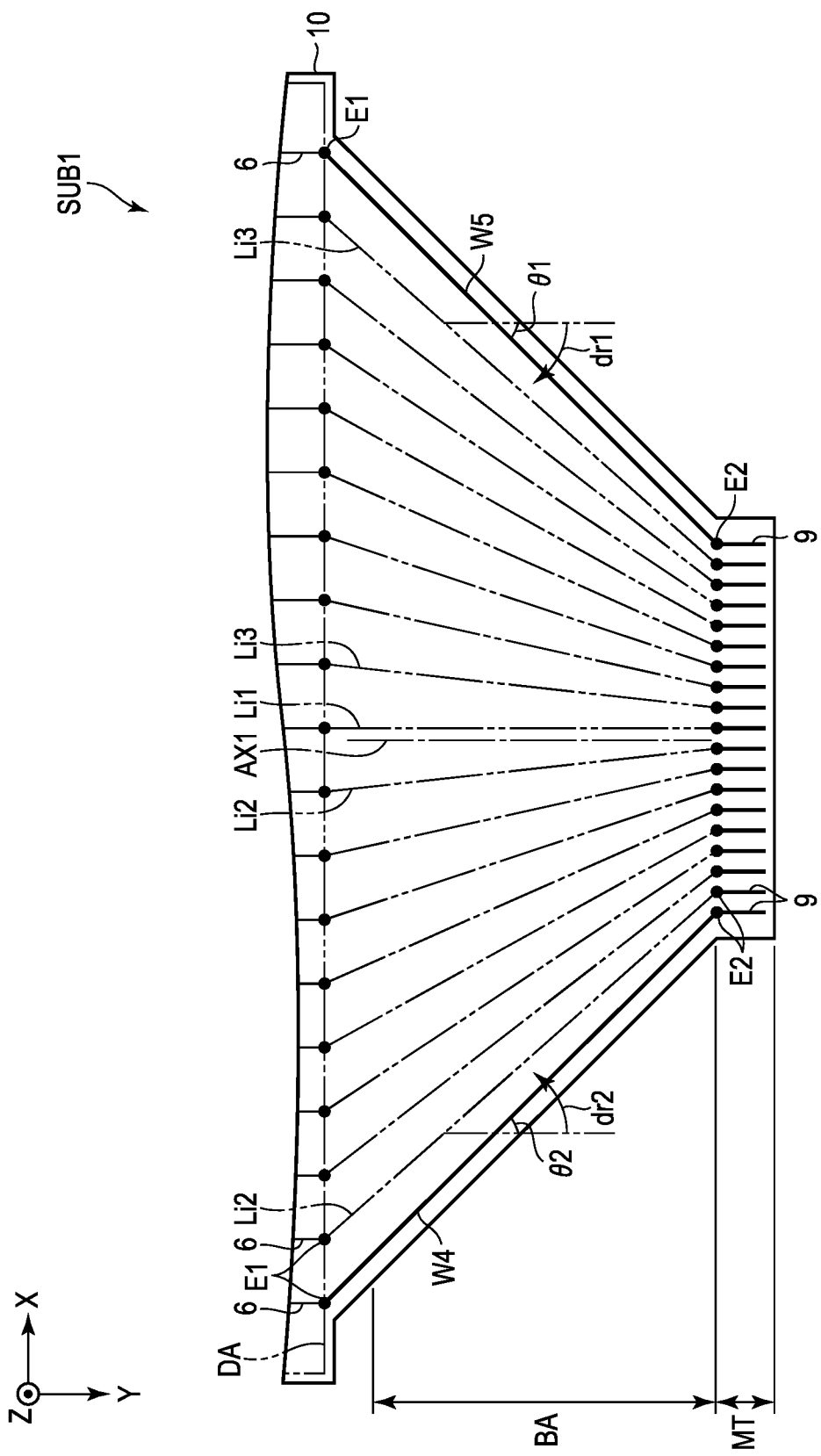
FIG. 6 is a plan view showing the first substrate shown in FIG. 5, except for a first line.

Here is a description of the reason why the first lines W1 are bent. FIG. 6 is a plan view showing the first substrate SUB1 shown in FIG. 5 except for the first lines W1. For the sake of convenience, FIG. 6 shows an imaginary line Li connecting the first and second ends E1 and E2 of each of the first lines W1 in a straight line.

As shown in FIG. 6, the imaginary lines Li in the first embodiment are classified into an imaginary line Li1, an imaginary line Li2 and an imaginary line Li3. The imaginary line Li1 is parallel to the first axis AX1. The imaginary line Li3 is inclined at an angle less than the first angle $\theta 1$ in the first rotational direction dr1 with respect to the first axis AX1. The imaginary line Li2 is inclined at an angle less than the second angle $\theta 2$ in the second rotational direction dr2 with respect to the first axis AX1. From the above, the first lines W1 can be increased in their reliability if they include a bending portion.

The display device DSP according to the first embodiment configured as described above includes a plurality of lines W to extend the bending area BA, such as a plurality of first lines W1. The first lines W1 each include a first linear portion W1a inclined at the first angle $\theta 1$ and a second linear portion W1b inclined at the second angle $\theta 2$, and are bent.

The above makes it possible to increase the reliability of the lines W of the display device DSP in the bending area BA. In the step of bending the display panel PNL in the bending area BA, the lines W can be prevented from being broken. The display device DSP can thus be increased in manufacturing yield.

First Modification to First Embodiment

Figure 7:
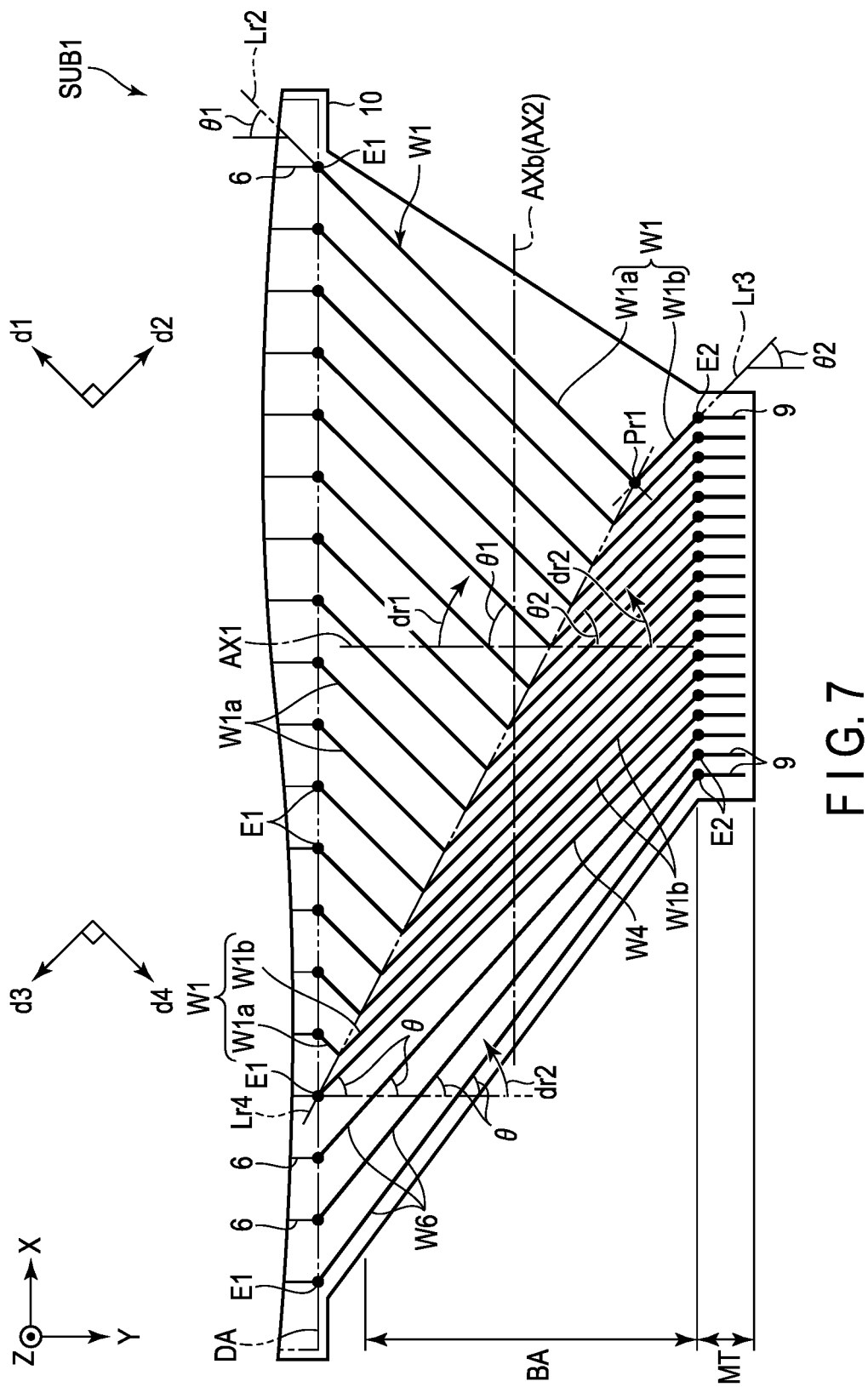

Next is a description of a display device according to a first modification to the first embodiment. FIG. 7 is a plan view showing part of a first substrate SUB1 of a display panel PNL of a display device DSP according to the first modification to the first embodiment described above, and showing a bending area BA and the like. Note that FIG. 7 shows a state before the bending area BA is bent.

As shown in FIG. 7, in the first modification, a pad area MT is shifted to the right from the center of a first insulating substrate 10 in the X direction.

A plurality of lines W include a plurality of first lines W1 and a fourth line W4 and do not include any equivalent for the fifth line W5. The inclination angle θ of the fourth line W4 is an acute angle that is equal to or greater than the second angle θ2. Since the lines W include the fourth line W4, they further include one or more sixth lines W6. In the first modification, the lines W include the sixth lines W6. Each of the sixth lines W6 extends in a straight line from the display area DA to the pad area MT.

Each of the sixth lines W6 is inclined at an acute angle beyond the second angle θ2 in the second rotational direction dr2 with respect to the first axis AX1. The inclination angle θ of each sixth line W6 exceeds the inclination angle θ of the fourth line W4. The sixth lines W6 are located opposite to the first lines W1 with respect to the fourth line W4. As the fourth line W4 and the sixth lines W6 move away from the first lines W1, their inclination angles θ increase gradually.

The first lines W1 are bent on a fourth reference line Lr4. The fourth reference line Lr4 extends in a straight line through a first end E1 of the fourth line W4 and a first reference point Pr1 at which second and third reference lines Lr2 and Lr3 intersect. The second reference line Lr2 extends in a straight line through a first end E1 of an endmost one of the first lines W1, which is located opposite to the fourth line W4, and is inclined at a first angle θ1 in the first rotational direction dr1 with respect to the first axis AX1. The third reference line Lr3 extends in a straight line through a second end E2 of the endmost first line W1 and is inclined at a second angle θ2 in the second rotational direction dr2 with respect to the first axis AX1. In the endmost first line W1, a first linear portion W1a extends on the second reference line Lr2, and a second linear portion W1b extends on the third reference line Lr3. In the first modification, the endmost first line W1 is a first line W1 at the right end.

Like the fourth line W4, each of the sixth lines W6 has no bending portion. This is because the inclination angle θ of each sixth line W6 exceeds the second angle θ2.

The display device DSP according to the first modification to the first embodiment configured as described above can also bring about the same advantages as those of the first embodiment.

Second Modification to First Embodiment

Figure 8:
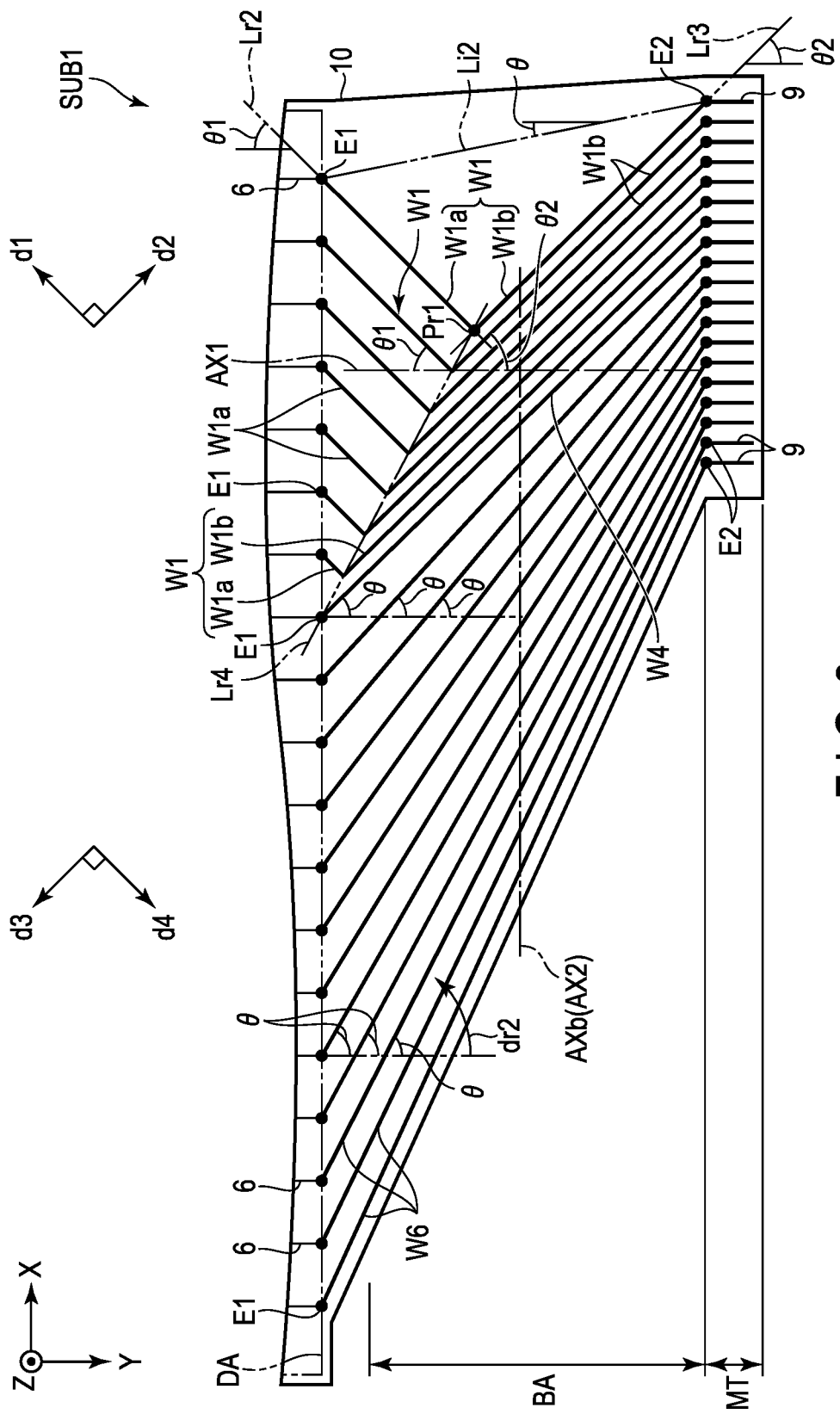

Next is a description of a display device according to a second modification to the first embodiment. FIG. 8 is a plan view showing part of a first substrate SUB1 of a display panel PNL of a display device DSP according to the second modification to the first embodiment described above, and showing a bending area BA and the like. Note that FIG. 8 shows a state before the bending area BA is bent. For the sake of convenience, FIG. 8 shows an imaginary line Li2 connecting first and second ends E1 and E2 of a right-end first line W1 in a straight line.

As shown in FIG. 8, the pad area MT of the second modification may be shifted further to the right side as compared with the first modification. The imaginary line Li2 is inclined at an angle less than the second angle 82 in the second rotational direction dr2 with respect to the first axis AX1. The imaginary line Li associated with a plurality of first lines W1 of the second modification is different from that of the above-described embodiment. The imaginary line Li associated with the first lines W1 is only the imaginary line Li2, and there are no imaginary lines corresponding to the imaginary lines Li1 and Li3.

Like in the first modification, in the second modification, the first lines W1 are bent on the fourth reference line Lr4. The second reference line Lr2 passes through a first end E1 of a right-end first line W1, and the third reference line Lr3 passes through a second end E2 of the right-end first line W1.

The display device DSP according to the second modification to the first embodiment configured as described above can also bring about the same advantages as those of the first embodiment.

Third Modification to First Embodiment

Figure 9:
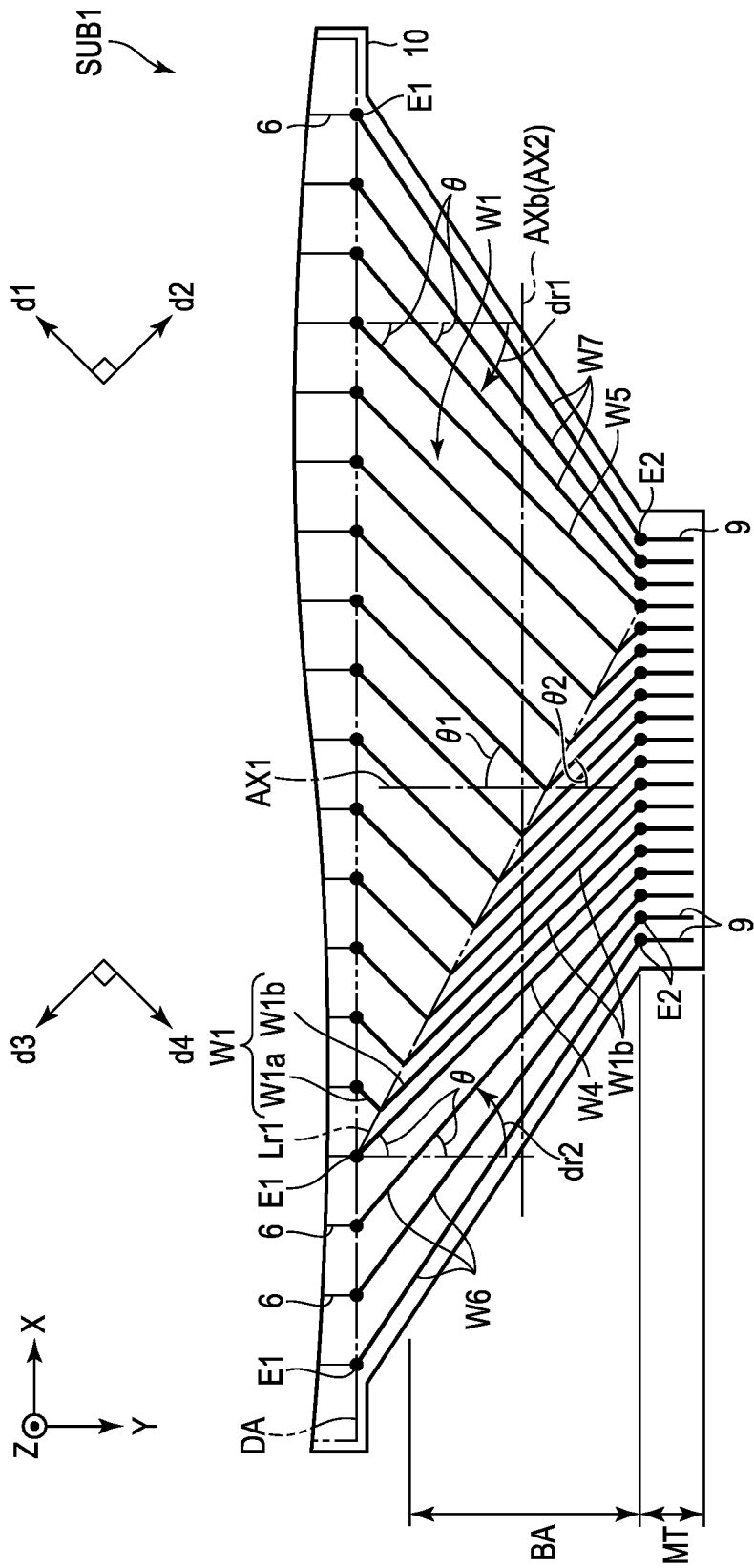

Next is a description of a display device according to a third modification to the first embodiment. FIG. 9 is a plan view showing part of a first substrate SUB1 of a display panel PNL of a display device DSP according to the third modification to the first embodiment described above, and showing a bending area BA and the like. Note that FIG. 9 shows a state before the bending area BA is bent.

The lines W of the third modification are narrowed from the display area DA toward the pad area MT more than those of the first embodiment. The length of the bending area BA of the third modification along the first axis AX1 is shorter than that in the first embodiment. The technique of the third modification described here can also be applied to the case where the second ends E2 of the lines W are packed more densely than those in the first embodiment.

As shown in FIG. 9, in the third modification, the inclination angle θ of the fourth line W4 is an acute angle that is equal to or greater than the second angle θ2. The inclination angle θ of the fifth line W5 is an acute angle that is equal to or greater than the first angle θ1. Since the lines W include the fourth line W4, they further include one or more sixth lines W6. In the third modification, the lines W include the sixth lines W6. Each of the sixth lines W6 extends in a straight line from the display area DA to the pad area MT. Since, furthermore, the lines W include the fifth line W5, they further include one or more seventh lines W7. In the third modification, the lines W include the seventh lines W7. Each of the seventh lines W7 extends in a straight line from the display area DA to the pad area MT.

The first lines W1 are bent on the first reference line Lr1. Like in the first embodiment, the first reference line Lr1 extends in a straight line through the first end E1 of the fourth line W4 and the second end E2 of the fifth line W5.

Each of the sixth lines W6 is inclined at an acute angle beyond the second angle θ2 in the second rotational direction dr2 with respect to the first axis AX1. The inclination angle θ of each sixth line W6 exceeds the inclination angle θ of the fourth line W4. The sixth lines W6 are located opposite to the first lines W1 with respect to the fourth line W4. As the fourth line W4 and the sixth lines W6 move away from the first lines W1, their inclination angles θ increase gradually.

Each of the seventh lines W7 is inclined at an acute angle beyond the first angle θ1 in the first rotation direction dr1 with respect to the first axis AX1. The inclination angle θ of each seventh line W7 exceeds the inclination angle θ of the fifth line W5. The seventh lines W7 are located opposite to the first lines W1 with respect to the fifth line W5. As the fifth line W5 and the seventh lines W7 move away from the first lines W1, their inclination angles θ increase gradually.

Like the fourth line W4, each of the sixth lines W6 has no bending portion. This is because the inclination angle θ of each sixth line W6 exceeds the second angle θ2.

Like the fifth line W5, each of the seventh lines W7 has no bending portion. This is because the inclination angle θ of each seventh line W7 exceeds the first angle θ1.

The display device DSP according to the third modification to the first embodiment configured as described above can also bring about the same advantages as those of the first embodiment.

Fourth Modification to First Embodiment

Figure 10:
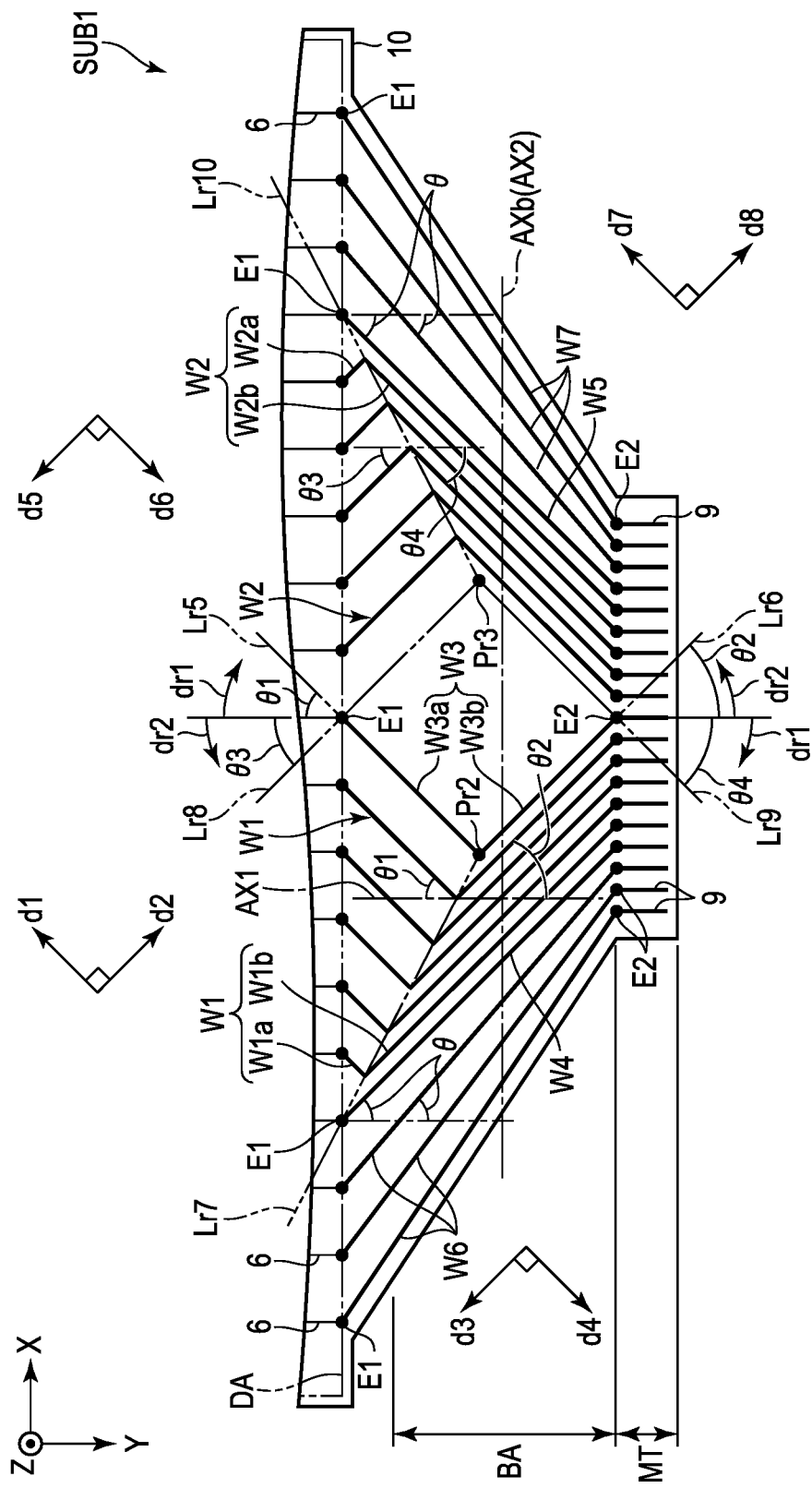

Next is a description of a display device according to a fourth modification to the first embodiment. FIG. 10 is a plan view showing part of a first substrate SUB1 of a display panel PNL of a display device DSP according to the fourth modification to the first embodiment described above, and showing a bending area BA and the like. Note that FIG. 10 shows a state before the bending area BA is bent.

As in the third modification, the lines W of the fourth modification are narrowed from the display area DA toward the pad area MT more than those of the first embodiment.

As shown in FIG. 10, the lines W of the fourth modification further include a plurality of second lines W2, a third line W3, one or more sixth lines W6 and one or more seventh lines W7 as well as a plurality of first lines W1, a fourth line W4 and a fifth line W5.

The first lines W1 are bent on a seventh reference line Lr7. The seventh reference line Lr7 extends in a straight line through a first end E1 of the fourth line W4 and a second reference point Pr2 at which fifth and sixth reference lines Lr5 and Lr6 intersect. The fifth reference line Lr5 extends in a straight line through a first end E1 of the third line W3 and is inclined at a first angle θ1 in the first rotational direction dr1 with respect to the first axis AX1. The sixth reference line Lr6 extends in a straight line through a second end portion E2 of the third line W3 and is inclined at a second angle θ2 in the second rotational direction dr2 with respect to the first axis AX1.

Each of the second lines W2 includes a first linear portion W2a located close to the display area DA and a second linear portion W2b located closer to the pad area MT than the first linear portion W2a and directly connected to the first linear portion W2a.

The first linear portions W2a of the second lines W2 extend in a fifth direction d5 and are arranged at intervals in a sixth direction d6 that is orthogonal to the fifth direction d5. The fifth direction d5 is inclined at a third angle θ3 in the second rotational direction dr2 with respect to the first axis AX1. The second linear portions W2b of the second lines W2 extend in a seventh direction d7 and are arranged at intervals in an eighth direction d8 that is orthogonal to the seventh direction d7. The seventh direction d7 is inclined at a fourth angle θ4 in the first rotational direction dr1 with respect to the first axis AX1.

In the second lines W2, the length of each first linear portion W2a gradually changes in the sixth direction d6, and the length of each second linear portion W2b gradually changes in the eighth direction d8. In each of the second lines W2, when the length of the first linear portion W2a is relatively short, the length of the second linear portion W2b is relatively long, and when the length of the first linear portion W2a is relatively long, the length of the second linear portion W2b is relatively short.

The second lines W2 are bent on a tenth reference line Lr10. The tenth reference line Lr10 extends in a straight line through a first end E1 of the fifth line W5 and a third reference point Pr3 at which eighth and ninth reference lines Lr8 and Lr9 intersect. The eighth reference line Lr8 extends in a straight line through a first end E1 of the third line W3 and is inclined at a third angle θ3 in the second rotational direction dr2 with respect to the first axis AX1. The ninth reference line Lr9 extends in a straight line through a second end E2 of the third line W3 and is inclined at a fourth angle θ4 in the first rotational direction dr1 with respect to the first axis AX1.

The third line W3 is located between the first lines W1 and the second lines W2. The third line W3 includes a first linear portion W3a and a second linear portion W3b directly connected to the first linear portion W3a. In the third line W3, the first linear portion W3a extends on the fifth reference line Lr5, and the second linear portion W3b extends on the sixth reference line Lr6. Alternatively, in the third line W3, the first linear portion W3a extends on the eighth reference line Lr8, and the second linear portion W3b extends on the ninth reference line Lr9. In the fourth modification, the first linear portion W3a extends on the fifth reference line Lr5, and the second linear portion W3b extends on the sixth reference line Lr6. In the fourth modification, the third line W3 is located at the center of the lines W in the X direction.

The fourth line W4 is located opposite to the third line W3 with respect to the first lines W1, and extends in a straight line from the display area DA to the pad area MT. The fourth line W4 is inclined at an acute angle of a second angle θ2 or more in the second rotational direction dr2 with respect to the first axis AX1. The fourth line W4 is adjacent to one of the first lines W1 which has the longest second linear portion W1b.

The fifth line W5 is located opposite to the third line W3 with respect to the second lines W2, and extends in a straight line from the display area DA to the pad area MT. The fifth line W5 is inclined at an acute angle of a fourth angle θ4 or more in the first rotational direction dr1 with respect to the first axis AX1. The fifth line W5 is adjacent to one of the second lines W2 which has the longest second linear portion W2b.

In the fourth modification, the lines W include a plurality of sixth lines W6 and a plurality of seventh lines W7.

Each of the sixth lines W6 is inclined at an acute angle beyond the second angle θ2 in the second rotational direction dr2 with respect to the first axis AX1. The inclination angle θ of each sixth line W6 exceeds the inclination angle θ of the fourth line W4. The sixth lines W6 are located opposite to the first lines W1 with respect to the fourth line W4. As the fourth line W4 and the sixth lines W6 move away from the first lines W1, their inclination angles θ increase gradually.

Each of the seventh lines W7 is inclined at an acute angle beyond the fourth angle θ4 in the first rotational direction dr1 with respect to the first axis AX1. The inclination angle θ of each seventh line W7 exceeds the inclination angle θ of the fifth line W5. The seventh lines W7 are located opposite to the second lines W2 with respect to the fifth line W5. As the fifth and seventh lines W5 and W7 move away from the second lines W2, their inclination angles θ increase gradually.

From the viewpoint of obtaining highly reliable lines W, for example, it is desirable that not only the first angle θ1 and the second angle θ2 but also the third angle θ3 and the fourth angle θ4 be each an acute angle of 45° or more. In the fourth modification, the first angle θ1, second angle θ2, third angle θ3 and fourth angle θ4 are the same.

Figure 11:
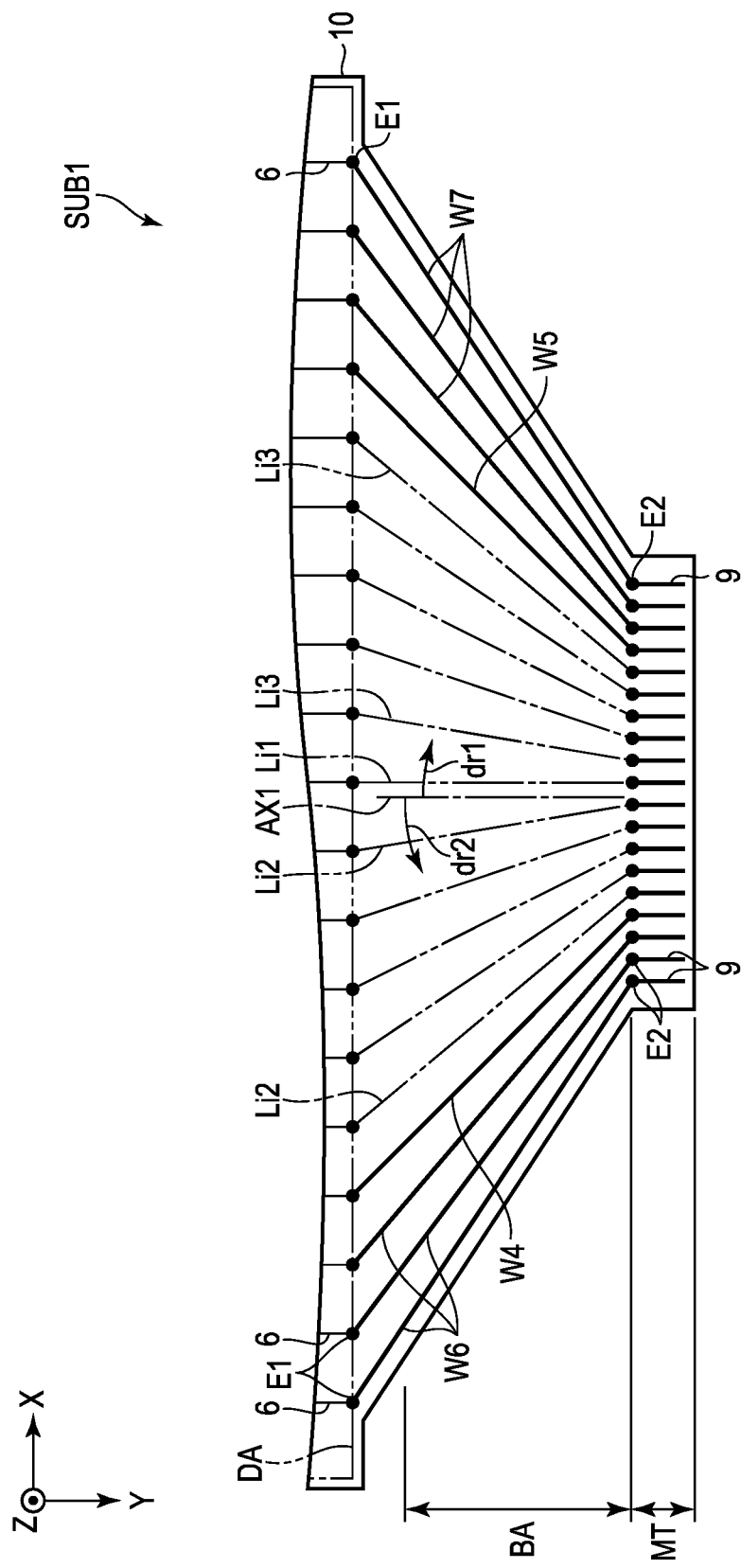
FIG. 11 is a plan view showing the first substrate shown in FIG. 10, except for a first line, a second line and a third line.

Here is a description of the reason why the first lines W1, the second lines W2 and the third line W3 are bent. FIG. 11 is a plan view showing a first substrate SUB1 shown in FIG. 10, except for the first, second and third lines W1, W2 and W3. For the sake of convenience, FIG. 11 shows an imaginary line Li connecting the first end portion E1 and the second end portion E2 in a straight line.

As shown in FIG. 11, the imaginary lines Li of the fourth modification are classified into an imaginary line Li1, an imaginary line Li2 and an imaginary line Li3. The imaginary line Li1 connects the first and second ends E1 and E2 of the third line W3 in a straight line. The imaginary line Li1 is parallel to the first axis AX1. The imaginary line Li2 connects the first and second ends E1 and E2 of each of the first lines W1 in a straight line. The imaginary line Li2 is inclined at an angle less than the second angle θ2 in the second rotational direction dr2 with respect to the first axis AX1. The imaginary line Li3 connects the first and second ends E1 and E2 of each of the second lines W2 in a straight line. The imaginary line Li3 is inclined at an angle less than the fourth angle θ4 in the first rotational direction dr1 with respect to the first axis AX1. From the above, the first lines W1 can be increased in their reliability if the first, second and third lines W1, W2 and W3 include bending portions.

The display device DSP according to the fourth modification to the first embodiment configured as described above can also bring about the same advantages as those of the first embodiment. The loads of the lines W vary symmetrically with regard to the central third line W3. It is thus possible to prevent non-uniformity in display from being caused in an image displayed on the display panel PNL.

First Comparative Example

Figure 12:
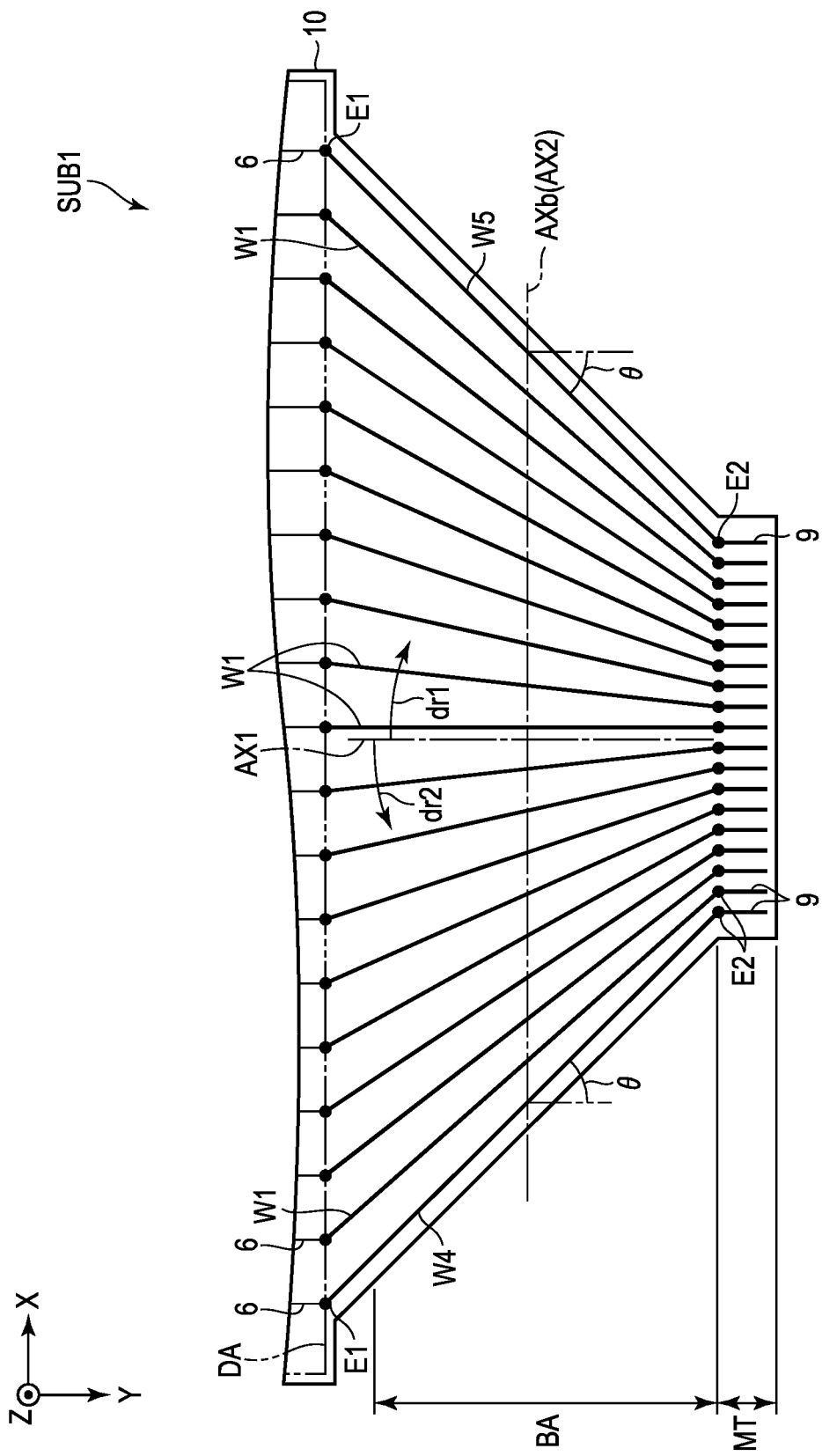

Next is a description of a display device according to a first comparative example. FIG. 12 is a plan view showing part of a first substrate SUB1 of a display panel PNL of a display device DSP according to the first comparative example, and showing a bending area BA and the like. Note that FIG. 12 shows a state before the bending area BA is bent.

As shown in FIG. 12, a plurality of lines W include a plurality of first lines W1, a fourth line W4 and a fifth line W5. The first lines W1 of the first comparative example differ from those of the first embodiment in that they are not bent. The first lines W1 include a first line W1 parallel to the first axis AX1, a first line W1 inclined at less than a first angle θ1 in a first rotational direction dr1 with respect to the first axis AX1, and a first line W1 inclined at less than a second angle θ2 in a second rotational direction dr2 with respect to the first axis AX1. For example, the trajectories of the first lines W1 of the first comparative example coincide with those of a plurality of imaginary lines Li shown in FIG. 6.

In the first comparative example, it is difficult to heighten the reliability of the first lines W1. This is because the inclination angle of each of the first lines W1 becomes too large with respect to a bending axis AXb.

Second Comparative Example

Figure 13:
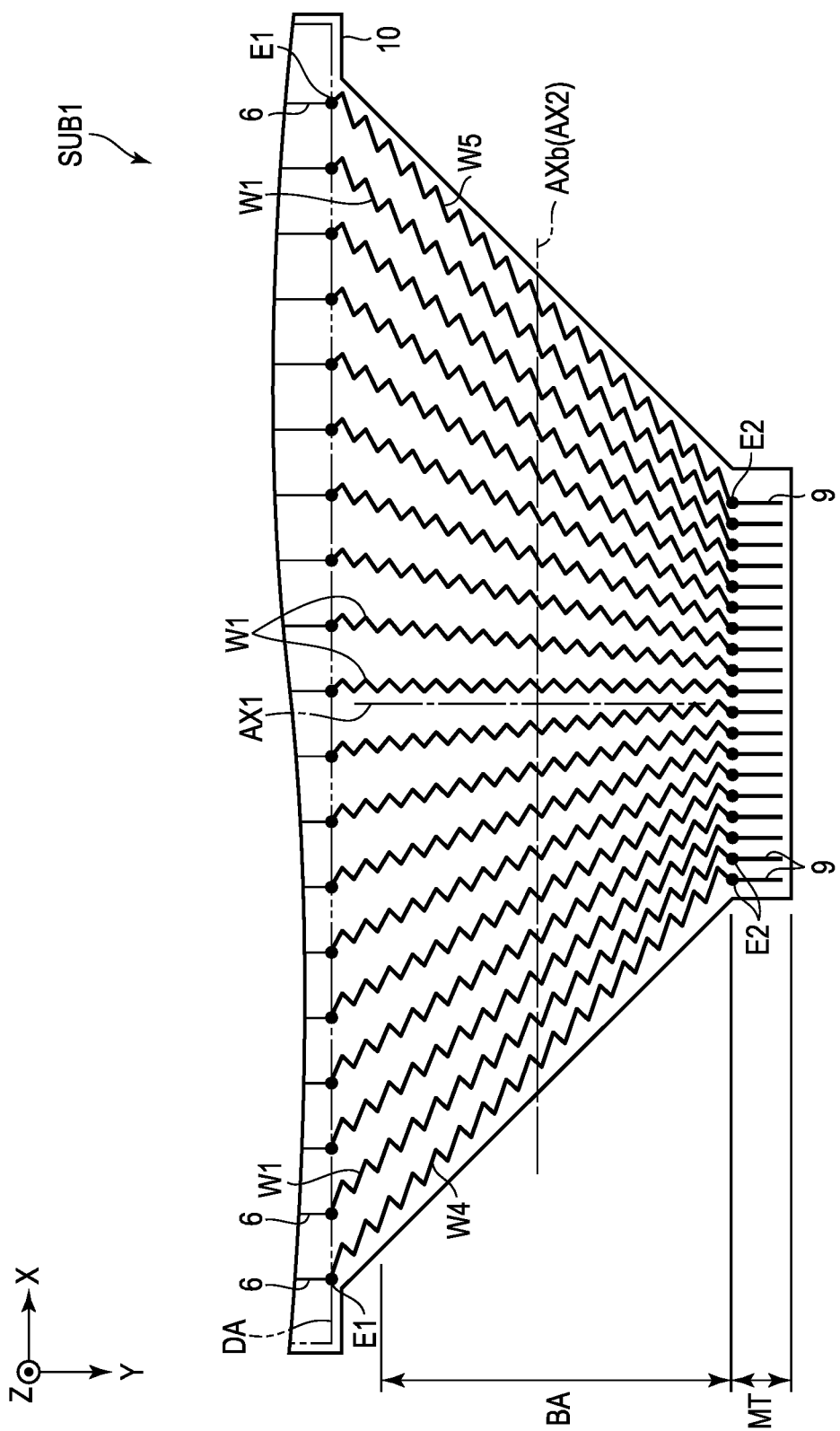

Next is a description of a display device according to a second comparative example. FIG. 13 is a plan view showing part of a first substrate SUB1 of a display panel PNL of a display device DSP according to the second comparative example, and showing a bending area BA and the like. Note that FIG. 13 shows a state before the bending area BA is bent.

As shown in FIG. 13, a plurality of lines W include a plurality of first lines W1, a fourth line W4 and a fifth line W5. The second comparative example differs from the first embodiment in that each of the lines W of the first comparative example is formed in a zigzag pattern. Each line W of the first comparative example extends while bending between its corresponding first and second ends E1 and E2.

In the second comparative example, it is difficult to heighten the reliability of the lines W1. This is because the lines W include a number of bending portions.

Second Embodiment

Figure 14:
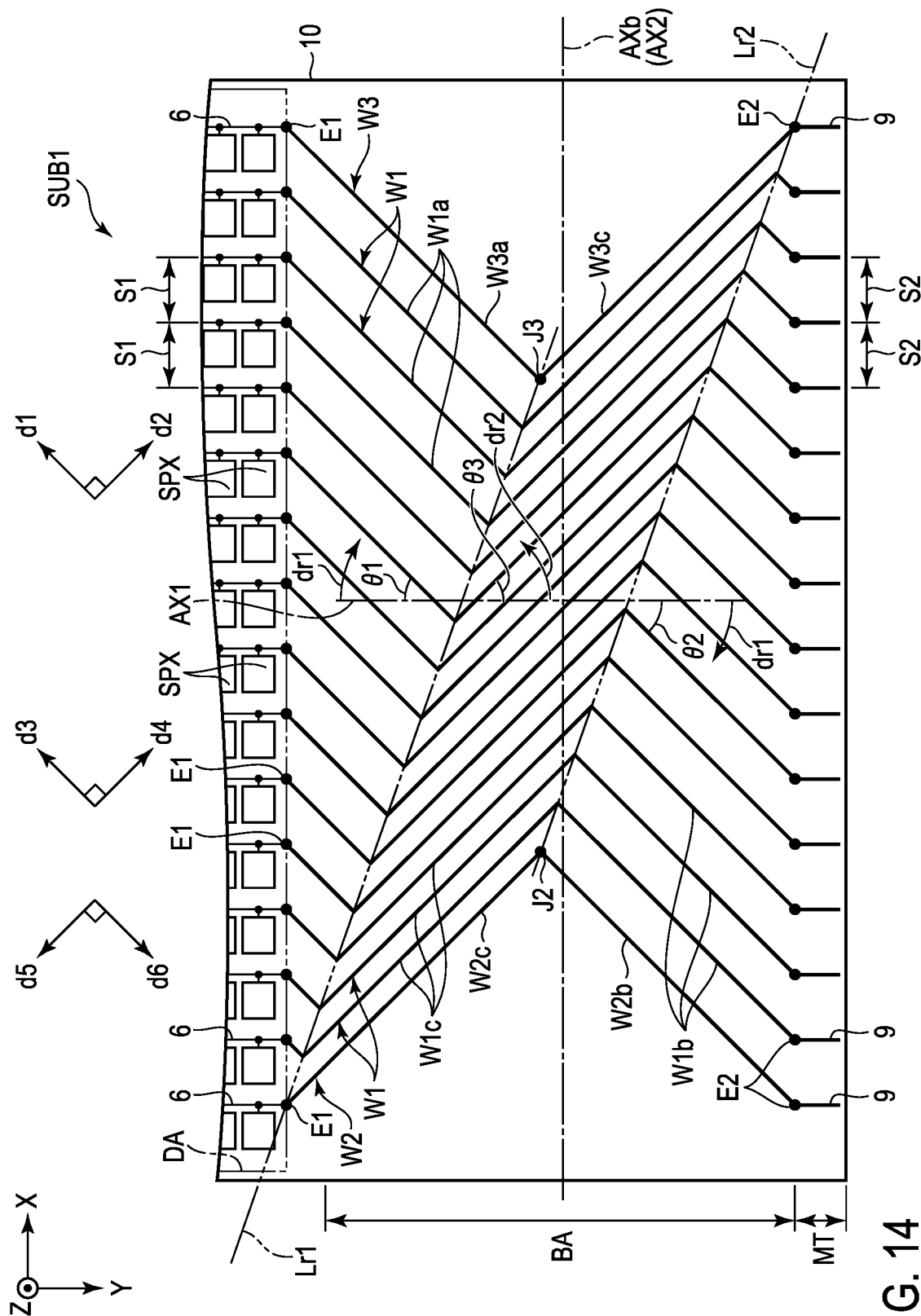

Next is a description of a display device DSP according to a second embodiment. The display device DSP according to the second embodiment is configured in the same manner as that of the first embodiment, except for the points described later. FIG. 14 is a plan view showing part of a first substrate SUB1 of a display panel PNL of a display device DSP according to the second embodiment, and showing a bending area BA and the like. Note that FIG. 14 shows a state before the bending area BA is bent.

As shown in FIG. 14, a plurality of first ends E1 are arranged at equal intervals in a direction parallel to a second axis AX2. A plurality of second ends E2 are arranged at equal intervals in a direction parallel to the second axis AX2. In the second embodiment, an interval S2 between second ends E2 is the same as an interval S1 between first ends E1.

A plurality of lines W include a plurality of first lines W1, a second line W2 and a third line W3. Each of the first lines W1 includes a first linear portion W1a located close to a display area DA, a second linear portion W1b located closer to a pad area MT than the first linear portion W1a, and a third linear portion W1c directly connected to the first linear portion W1a and the second linear portion W1b. The second line W2 includes a second linear portion W2b located close to the pad area MT and a third linear portion W2c located close to the display area DA and directly connected to the second linear portion W2b. The third line W3 includes a first linear portion W3a located close to the display area DA and a third linear portion W3c located close to the pad area MT and directly connected to the first linear portion W3a. The third line W3 is located opposite to the second line W2 with respect to the first lines W1.

The first linear portions W1a and W3a of the first and third lines W1 and W3 extend in a first direction d1 and are arranged at intervals in a second direction d2 that is orthogonal to the first direction d1. The first direction d1 is a direction inclined at a first angle θ1 that is an acute angle in a first rotational direction dr1 with respect to the first axis AX1.

The second linear portions W1b and W2b of the first and second lines W1 and W2 extend in a third direction d3 and are arranged at intervals in a fourth direction d4 that is orthogonal to the third direction d3. The third direction d3 is a direction inclined at a second angle θ2 that is an acute angle in the first rotational direction dr1 with respect to the first axis AX1.

The third linear portions W1c, W2c and W3c of the first, second and third lines W1, W2 and W3 extend in a fifth direction d5 and are arranged at intervals in a sixth direction d6 that is orthogonal to the fifth direction d5. The fifth direction d5 is a direction inclined at a third angle θ3 that is an acute angle in a second rotational direction dr2 with respect to the first axis AX1.

The lengths of the first linear portions W1a and W3a change gradually in the second direction d2. The lengths of the second linear portions W1b and W2b change gradually in the sixth direction d6. In each of the first lines W1, when the length of the first linear portion W1a is relatively short, the length of the second linear portion W1b is relatively long, and when the length of the first linear portion W1a is relatively long, the length of the second linear portion W1b is relatively short. For example, the lengths of the third linear portions W1c, W2c and W3c are the same.

In the second embodiment, the first angle θ1, second angle θ2 and third angle θ3 are the same. Since the lines W are inclined with respect to the first axis AX1, their reliability can be heightened in the bending area BA. From the viewpoint of obtaining the highly reliable lines W, for example, it is desirable that the first angle θ1, second angle θ2 and third angle θ3 be each an acute angle of 45° or more.

The second line W2 is bent at a connecting portion J2 between the third and second linear portions W2c and W2b of the second line W2. The third line W3 is bent at a connecting portion J3 between the third and first linear portions W3c and W3a of the third line W3.

The first lines W1 are bent on a first reference line Lr1 and a second reference line Lr2. The first reference line Lr1 extends in a straight line through the first end E1 of the second line W2 and the connecting portion J3. The second reference line Lr2 extends in a straight line through the second end E2 of the third line W3 and the connecting portion J2.

Figure 15:
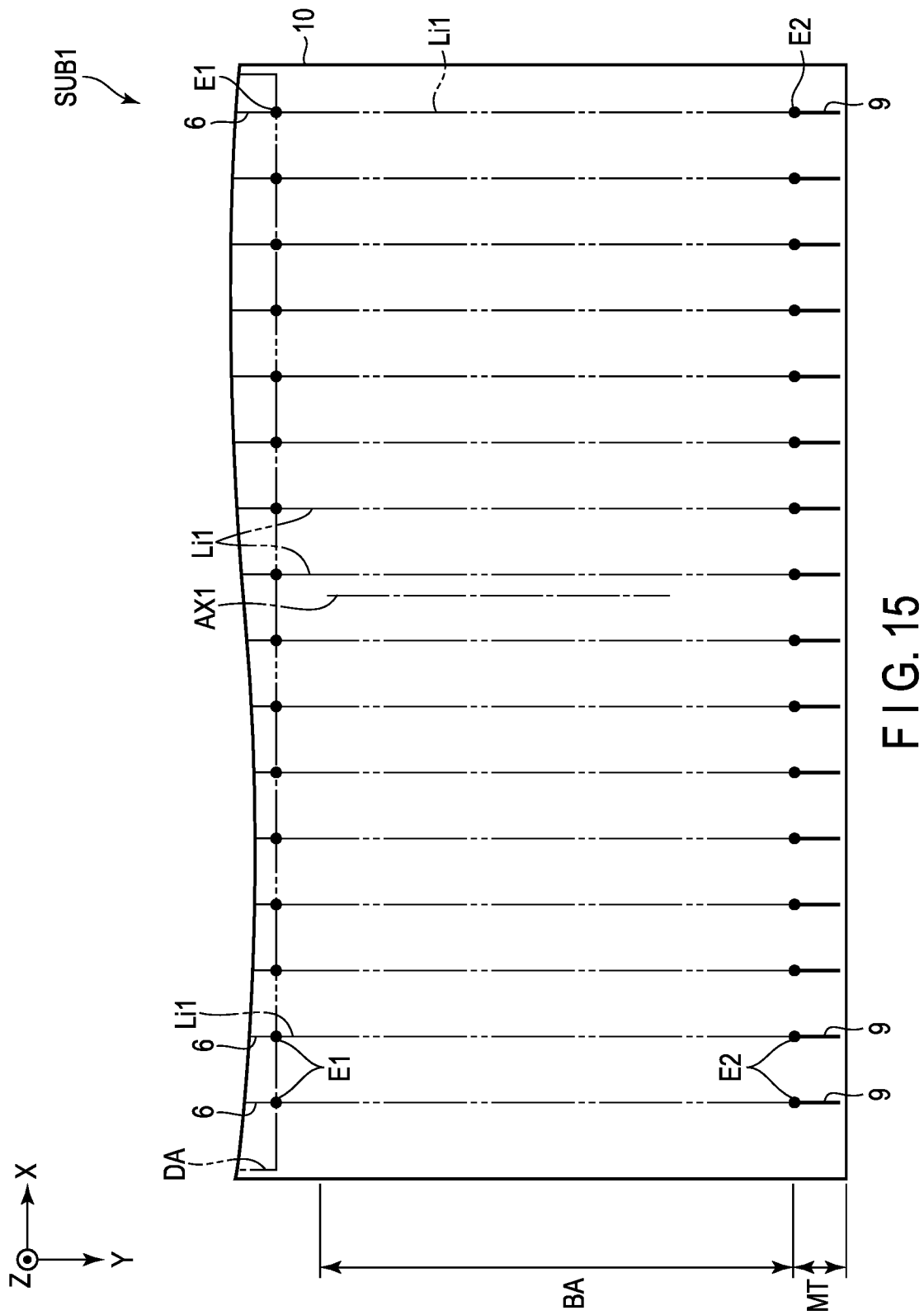
FIG. 15 is a plan view showing the first substrate shown in FIG. 14, except for a line.

Here is a description of the reason why the lines W are bent. FIG. 15 is a plan view showing a first substrate SUB1 shown in FIG. 14, except for the lines W. For the sake of convenience, FIG. 15 shows an imaginary line Li1 connecting the first and second ends E1 and E2 of each of the lines W in a straight line.

As shown in FIG. 15, the imaginary line Li1 is parallel to the first axis AX1. From the above, the lines W can be increased in their reliability if they include a bending portion.

The display device DSP according to the second embodiment configured as described above includes a plurality of lines W extending in the bending area BA. The lines W include linear portions inclined at a first angle θ1 and linear portions inclined at a second angle θ2 and are bent. The number of bending portions (bending points) of each of the lines W can be suppressed to two or less.

The above makes it possible to increase the reliability of the lines W of the display device DSP in the bending area BA. In the step of bending the display panel PNL in the bending area BA, the lines W can be prevented from being broken. The display device DSP can thus be increased in manufacturing yield.

First Modification to Second Embodiment

Figure 16:
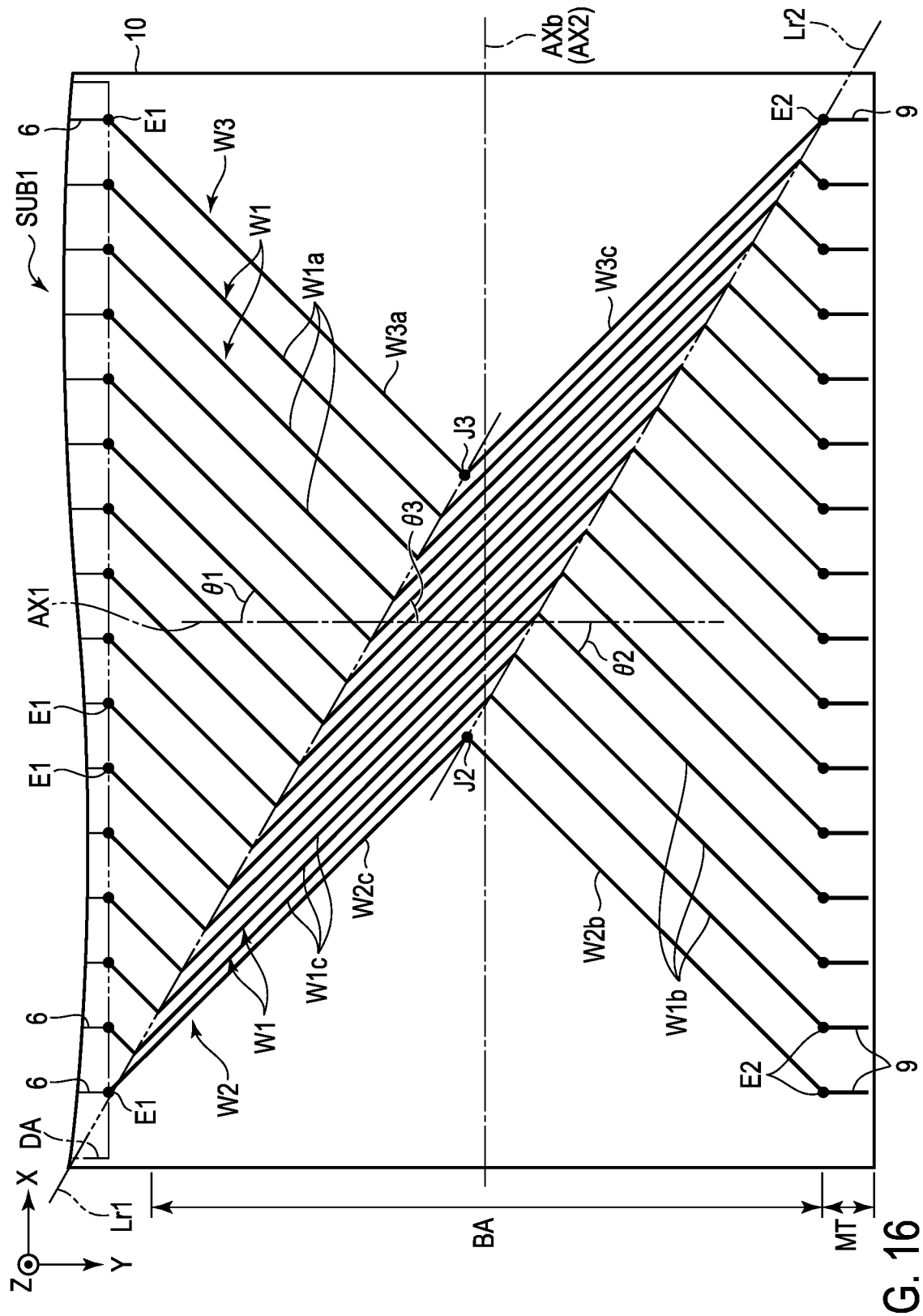

Next is a description of a display device according to a first modification to the second embodiment. FIG. 16 is a plan view showing part of a first substrate SUB1 of a display panel PNL of a display device DSP according to the first modification to the second embodiment, and showing a bending area BA and the like. Note that FIG. 16 shows a state before the bending area BA is bent. The length of the bending area BA of the first modification along a first axis AX1 is greater than that in the second embodiment.

As shown in FIG. 16, the layout technique of a plurality of lines W of the first modification is the same as that of the second embodiment. Since, however, the bending area BA of the first modification is long, the third linear portions W1c, W2c and W3c of a plurality of first lines W1, a second line W2 and a third line W3 easily become dense. The interval between the third linear portions W1c, W2c and W3c in a sixth direction d6 is narrower than that in the second embodiment. Thus, the length of the bending area BA has only to be adjusted within a range where the line and space (L/S) of the lines W does not exceed a reference value. Note that the L/S represents the distance between the centers of the widths of the lines W (linear portions).

The display device DSP according to the first modification to the second embodiment configured as described above can also bring about the same advantages as those of the second embodiment.

Second Modification to Second Embodiment

Next is a description of a display device according to a second modification to the second embodiment. FIG. 17 is a plan view showing part of a first substrate SUB1 of a display panel PNL of a display device DSP according to the second modification to the second embodiment, and showing a bending area BA and the like. Note that FIG. 17 shows a state before the bending area BA is bent. The length of the bending area BA of the second modification along a first axis AX1 is greater than that in the first modification to the second embodiment.

As shown in FIG. 17, a plurality of lines W include a plurality of line groups WG. The lines W are so configured that the line groups WG are arranged repeatedly n times in a direction parallel to the first axis AX1, wherein n is an integer of 2 or more. In this second modification, n is equal to 2 (n=2). Each of the line groups WG includes a plurality of first lines W1, a second line W2 and a third line W3.

The first line W1 of one line group WG is directly connected to the first line W1 of another line group WG. These two first lines W1 have the same shape. The second line W2 of one line group WG is directly connected to the second line W2 of another line group WG. These two second lines W2 have the same shape. The third line W3 of one line group WG is directly connected to the third line W3 of another line group WG. These two third lines W3 have the same shape.

The display device DSP according to the first modification to the second embodiment configured as described above can also bring about the same advantages as those of the second embodiment. Even though the bending area BA is long, the inclination angles of the lines W can be maintained at a first angle θ1, a second angle θ2 and a third angle θ3, the number of bending portions of the lines W can be suppressed, and the L/S of the lines W can be suppressed within a range not exceeding a reference value.

Third Modification to Second Embodiment

Figure 18:
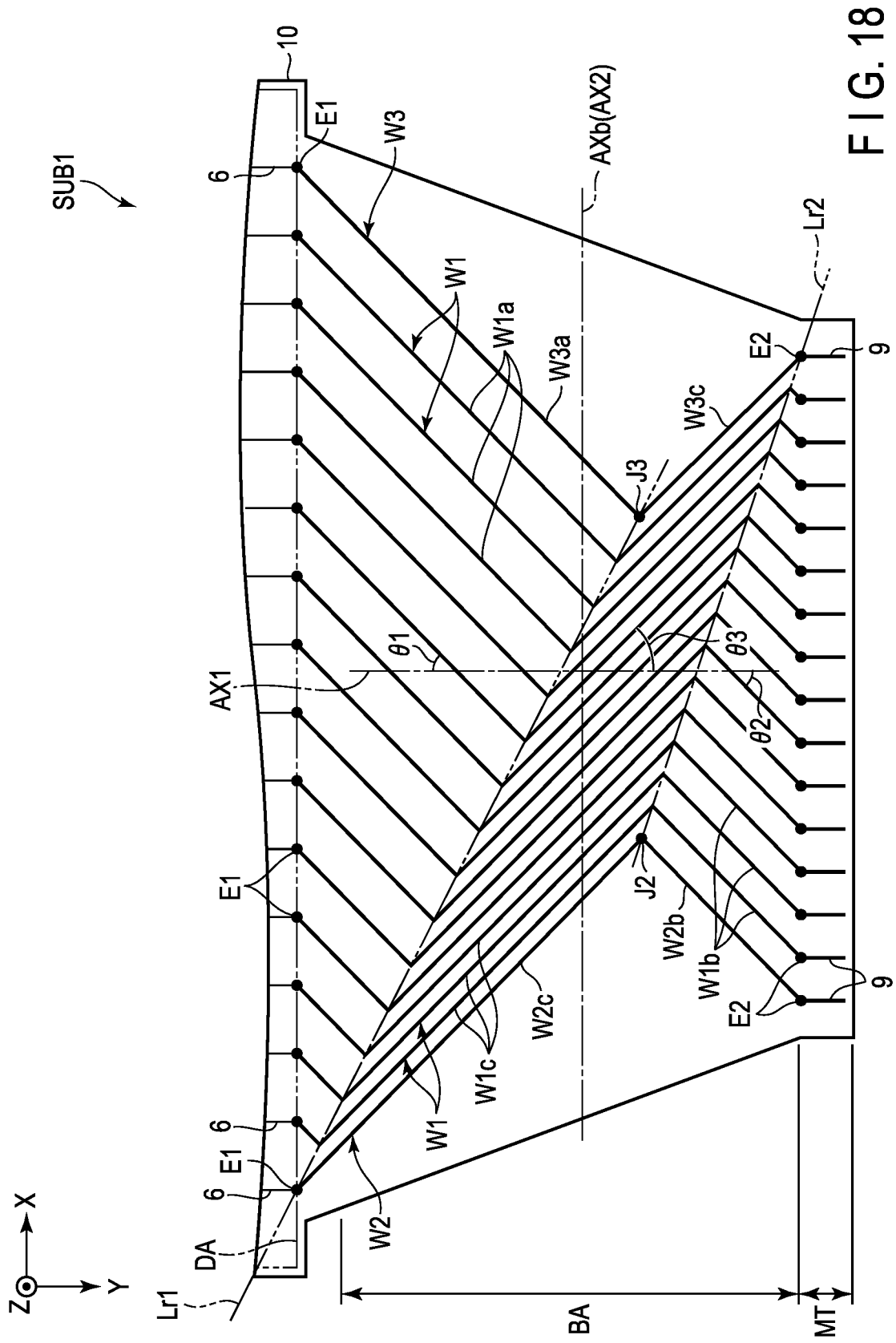

Next is a description of a display device according to a third modification to the second embodiment. FIG. 18 is a plan view showing part of a first substrate SUB1 of a display panel PNL of a display device DSP according to the third modification to the second embodiment, and showing a bending area BA and the like. Note that FIG. 18 shows a state before the bending area BA is bent.

As shown in FIG. 18, the layout technique of a plurality of lines W of the third modification is the same as that of the second embodiment. However, in the third modification, an interval S2 between second ends E2 is narrower than an interval S1 between first ends E1. Thus, the lengths of a plurality of third linear portions W1c, W2c and W3c change gradually in a sixth direction d6. In each of first lines W1, when the length of a first linear portion W1a is relatively short, the length of a third linear portion W1c is relatively long, and when the length of the first linear portion W1a is relatively long, the length of the third linear portion W1c is relatively short.

The display device DSP according to the third modification to the second embodiment configured as described above can also bring about the same advantages as those of the second embodiment.

In the second embodiment, too, as shown in FIG. 12, it is not desirable to use a line W which is not bent and whose inclination angles are less than a first angle θ1, a second angle θ2 and a third angle θ3. Also in the second embodiment, it is not desirable to use lines W in a zigzag pattern, as shown in FIG. 13. In these cases, it is difficult to obtain a line W with high reliability.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

For example, the intervals S1 between the first ends E1 depend on the intervals between the signal lines 6 and need not be equal intervals but may be unequal intervals. The intervals S2 between the second ends E2 need not be equal intervals but may be unequal intervals.

The foregoing display panel is not limited to an organic EL display panel or the foregoing display device is not limited to an organic EL display device. For example, the foregoing embodiments can be applied to a liquid crystal display panel and a liquid crystal display device each having a liquid crystal element as an electro-optic element. In this case, the display panel PNL is a liquid crystal display panel and includes, for example, a first substrate SUB1, a second substrate, a liquid crystal layer held between the first and second substrates, and, if necessary, polarizers on both the upper and lower sides of the liquid crystal layer.

What is claimed is:

1. A display device comprising:
   an insulating substrate including a display area, a pad area, and a bending area located between the display area and the pad area and extending along a first axis; and
   a plurality of lines arranged above the insulating substrate and extending in the bending area from the display area to the pad area,
   wherein
   the plurality of lines include a plurality of first lines each including a first linear portion located close to the display area and a second linear portion located closer to the pad area than the first linear portion and directly connected to the first linear portion,
   a plurality of the first linear portions of the first lines extend in a first direction inclined at a first angle that is an acute angle in a first rotational direction with respect to the first axis, and are arranged at intervals in a second direction that is orthogonal to the first direction,
   a plurality of the second linear portions of the first lines extend in a third direction inclined at a second angle that is an acute angle in a second rotational direction opposite to the first rotational direction with respect to the first axis, and are arranged at intervals in a fourth direction that is orthogonal to the third direction,
   a length of each of the plurality of first linear portions increases in the second direction,
   a length of each of the plurality of second linear portions increases in the fourth direction, and
   in each adjacent pair of the of the plurality of first lines, the first linear portion of a first line of the first lines is longer than the first linear portion of another first line of the first lines and the second linear portion of the another first line is longer than the second linear portion of the first line.

2. The display device of claim 1, wherein the first angle and the second angle are same.

3. The display device of claim 1, wherein the first angle and the second angle are each an acute angle of 45° or more.

4. The display device of claim 1, wherein an imaginary line connecting a first end located close to the display area of each of the first lines and a second end located close to the pad area in a straight line is parallel to the first axis, or is inclined at less than the first angle in the first rotational direction with respect to the first axis, or is inclined at less than the second angle in the second rotational direction with respect to the first axis.

5. The display device of claim 1, wherein
   the plurality of lines further include at least one of a fourth line and a fifth line extending in a straight line from the display area to the pad area,
   the fourth line is inclined at an acute angle of the second angle or more in the second rotational direction with respect to the first axis, and is adjacent to the first line which includes a longest second linear portion among the first lines, and
   the fifth line is inclined at an acute angle of the first angle or more in the first rotational direction with respect to the first axis, located opposite to the fourth line with respect to the first lines, and is adjacent to the first line which includes a longest first linear portion among the first lines.

6. The display device of claim 5, wherein
   the plurality of lines include both the fourth line and the fifth line, and
   the plurality of lines are bent on a first reference line extending in a straight line through a first end of the fourth line located close to the display area and a second end of the fifth line located close to the pad area.

7. The display device of claim 5, wherein
   the plurality of lines further include one or more sixth lines extending in a straight line from the display area to the pad area when the lines include the fourth line,
   the plurality of lines further include one or more seventh lines extending in a straight line from the display area to the pad area when the lines include the fifth line,
   the sixth lines are inclined at an acute angle beyond the second angle in the second rotational direction with respect to the first axis and located opposite to the first lines with respect to the fourth line,
   the seventh lines are inclined at an acute angle beyond the first angle in the first rotational direction with respect to the first axis and located opposite to the first lines with respect to the fifth line,
   the fourth line and the sixth lines increase in inclination angle as the fourth line and the sixth lines move away from the first lines, and
   the fifth line and the seventh lines increase in inclination angle as the fifth line and the seventh lines move away from the first lines.

8. The display device of claim 5, wherein
the plurality of lines include the fourth line and do not include the fifth line,
the plurality of lines each include a first end located close to the display area and a second end located close to the pad area,
the first lines are bent on a fourth reference line extending in a straight line through the first end of the fourth line and a first reference point at which a second reference line and a third reference line intersect,
the second reference line extends in a straight line through the first end of the first line of an end which is located opposite to the fourth line among the first lines, and is inclined at the first angle in the first rotational direction with respect to the first axis,
the third reference line extends in a straight line through the second end of the first line of the end and is inclined at the second angle in the second rotational direction with respect to the first axis, and
in the first line of the end, the first linear portion extends on the second reference line and the second linear portion extends on the third reference line.

9. The display device of claim 1, wherein
the plurality of lines include a plurality of second lines each including a first linear portion located close to the display area and a second linear portion located close to the pad area than the first linear portion and directly connected to the first linear portion, a third line located between the first lines and the second lines, a fourth line located opposite to the third line with respect to the first lines and extending in a straight line from the display area to the pad area, and a fifth line located opposite to the third line with respect to the second lines and extending in a straight line from the display area to the pad area,
the plurality of lines each include a first end located close to the display area and a second end located close to the pad area,
a plurality of first linear portions of the second lines extend in a fifth direction inclined at a third angle in the second rotational direction with respect to the first axis, and are arranged at intervals in a sixth direction that is orthogonal to the fifth direction,
a plurality of second linear portions of the second lines extend in a seventh direction inclined at a fourth angle in the first rotational direction with respect to the first axis, and are arranged at intervals in an eighth direction that is orthogonal to the seventh direction,
in the second lines, a length of each of the first linear portions changes gradually in the sixth direction, and a length of each of the second linear portions changes gradually in the eighth direction,
the fourth line is inclined at an acute angle of the second angle or more in the second rotational direction with respect to the first axis, and is adjacent to the first line which includes a longest second linear portion among the first lines, and
the fifth line is inclined at an acute angle of the fourth angle or more in the first rotational direction with respect to the first axis, and is adjacent to the second line which includes a longest second linear portion among the second lines.

10. The display device of claim 9, wherein
the first lines are bent on a seventh reference line extending in a straight line through the first end of the fourth line and a second reference point at which a fifth reference line and a sixth reference line intersect,
the second lines are bent on a tenth reference line extending in a straight line through the first end of the fifth line and a third reference point at which an eighth reference line and a ninth reference line intersect,
the fifth reference line extends in a straight line through the first end of the third line and is inclined at the first angle in the first rotational direction with respect to the first axis,
the sixth reference line extends in a straight line through the second end of the third line and is inclined at the second angle in the second rotational direction with respect to the first axis,
the eighth reference line extends in a straight line through the first end of the third line and is inclined at the third angle in the second rotational direction with respect to the first axis,
the ninth reference line extends in a straight line through the second end of the third line and is inclined at the fourth angle in the first rotational direction with respect to the first axis, and
the third line includes a first linear portion extending on the fifth reference line and a second linear portion extending on the sixth reference line and directly connected to the first linear portion, or
the third line includes a first linear portion extending on the eighth reference line and a second linear portion extending on the ninth reference line and directly connected to the first linear portion.

11. The display device of claim 9, wherein
an end of the third line is located at a center of the plurality of lines in a direction parallel to a second axis which is orthogonal to the first axis.

12. The display device of claim 1, wherein the bending area has a bending axis orthogonal to the first axis and is bent with reference to the bending axis.

13. The display device of claim 1, wherein
the plurality of lines each include a first end located close to the display area and a second end located close to the pad area,
locations of first ends of the lines are aligned in a direction parallel to a second axis that is orthogonal to the first axis, and
locations of second ends of the lines are aligned in a direction parallel to the second axis.

14. The display device of claim 13, wherein
the first ends are arranged at equal intervals in a direction parallel to the second axis, and
the second ends are arranged at equal intervals in the direction parallel to the second axis.

15. The display device of claim 14, wherein an interval between the second ends is narrower than an interval between the first ends.

16. A display device comprising:
an insulating substrate including a display area, a pad area, and a bending area located between the display area and the pad area and extending along a first axis; and
a plurality of lines arranged above the insulating substrate and extending in the bending area from the display area to the pad area,
wherein
the plurality of lines include a plurality of first lines each including a first linear portion located close to the display area, a second linear portion located closer to the pad area than the first linear portion, and a third linear portion directly connected to the first linear portion and the second linear portion, a second line including a second linear portion located close to the pad area and a third linear portion located close to the display area and directly connected to the second linear portion, and a third line which includes a first linear portion located close to the display area and a third linear portion located close to the pad area and directly connected to the first linear portion and which is located opposite to the second line with respect to the first lines, a plurality of the first linear portions of the first lines and the third line extend in a first direction inclined at a first angle that is an acute angle in a first rotational direction with respect to the first axis, and are arranged at intervals in a second direction that is orthogonal to the first direction, a plurality of the second linear portions of the first lines and the second line extend in a third direction inclined at a second angle that is an acute angle in the first rotational direction with respect to the first axis, and are arranged at intervals in a fourth direction that is orthogonal to the third direction, a plurality of the third linear portions of the first lines, the second line and the third line extend in a fifth direction inclined at a third angle that is an acute angle in a second rotational direction opposite to the first rotational direction with respect to the first axis, and are arranged at intervals in a sixth direction that is orthogonal to the fifth direction, a length of each of the plurality of first linear portions increases in the second direction, a length of each of the plurality of second linear portions increases in the fourth direction, and in each adjacent pair of those of the plurality of first lines, the first linear portion of a first line of the first lines is longer than the first linear portion of another first line of the first lines and the second linear portion of the another first line is longer than the second linear portion of the first line.

17. The display device of claim 16, wherein the first angle, the second angle and the third angle are same.

18. The display device of claim 16, wherein the first angle, the second angle and the third angle are each an acute angle of 45° or more.

19. The display device of claim 16, wherein the plurality of lines each include a first end located close to the display area and a second end located close to the pad area, the second line is bent at a connecting portion between the second linear portion and the third linear portion of the second line, the third line is bent at a connecting portion between the first linear portion and the third linear portion of the third line, the first lines are bent on a first reference line extending in a straight line through the first end of the second line and the connecting portion between the first linear portion and the third linear portion of the third line, and the first lines are bent on a second reference line extending in a straight line through the second end of the third line and the connecting portion between the second linear portion and the third linear portion of the second line.

20. The display device of claim 16, wherein an imaginary line connecting a first end of each of the first lines, the second line and the third line, which is located close to the display area, and a second end thereof located close to the pad area, in a straight line is parallel to the first axis.

21. The display device of claim 20, wherein:

the plurality of lines are configured by a plurality of line groups arranged in a direction parallel to the first axis; and the line groups each include the first lines, the second line and the third line.

22. The display device of claim 16, wherein the bending area includes a bending axis that is orthogonal to the first axis and is bent with reference to the bending axis.

23. The display device of claim 16, wherein the plurality of lines each include a first end located close to the display area and a second end located close to the pad area, locations of first ends of the lines are aligned in a direction parallel to a second axis that is orthogonal to the first axis, and locations of second ends of the lines are aligned in a direction parallel to the second axis.

24. The display device of claim 23, wherein the first ends are arranged at equal intervals in a direction parallel to the second axis, and the second ends are arranged at equal intervals in the direction parallel to the second axis.

25. The display device of claim 24, wherein an interval between the second ends is narrower than an interval between the first ends.

* * * * *